US012701768B2

(12) United States Patent
Song et al.

(10) Patent No.: US 12,701,768 B2
(45) Date of Patent: Aug. 4, 2026

(54) SEMICONDUCTOR DEVICE INCLUDING EXTENDED BACKSIDE CONTACT STRUCTURE

(71) Applicant: SAMSUNG ELECTRONICS CO., LTD., Suwon-si (KR)

(72) Inventors: Seung Min Song, Halfmoon, NY (US); Panjae Park, Clifton Park, NY (US); Kang-ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 370 days.

(21) Appl. No.: 18/373,058

(22) Filed: Sep. 26, 2023

(65) Prior Publication Data

US 2024/0290853 A1 Aug. 29, 2024

Related U.S. Application Data

(60) Provisional application No. 63/448,513, filed on Feb. 27, 2023.

(51) Int. Cl.
H10D 64/23 (2025.01)
H10D 64/01 (2025.01)

(52) U.S. Cl.
CPC ........... H10D 64/256 (2025.01); H10D 64/01 (2025.01)

(58) Field of Classification Search
None
See application file for complete search history.

(56) References Cited

U.S. PATENT DOCUMENTS

| | | | |
|---|---|---|---|
| 10,770,479 B2 | 9/2020 | Smith et al. | |
| 11,362,090 B2 | 6/2022 | Wu et al. | |
| 2020/0075771 A1 | 3/2020 | Kobrinsky et al. | |
| 2021/0343715 A1 | 11/2021 | Wu et al. | |
| 2021/0366906 A1 | 11/2021 | Huang et al. | |
| 2021/0399099 A1 | 12/2021 | Chu et al. | |
| 2022/0069117 A1* | 3/2022 | Yu | H10D 64/017 |
| 2022/0181453 A1 | 6/2022 | Liebmann et al. | |
| 2022/0199624 A1 | 6/2022 | Huang et al. | |
| 2022/0270935 A1 | 8/2022 | Yang et al. | |
| 2022/0271033 A1 | 8/2022 | Chanemougame et al. | |
| 2022/0319981 A1 | 10/2022 | Chung et al. | |
| 2023/0064183 A1 | 3/2023 | Parikh et al. | |
| 2023/0207623 A1* | 6/2023 | Guler | H10D 30/0198 257/14 |
| 2024/0128318 A1 | 4/2024 | Xie et al. | |
| 2024/0213338 A1* | 6/2024 | Li | H10D 64/256 |

FOREIGN PATENT DOCUMENTS

EP          4 421 860 A1     8/2024

OTHER PUBLICATIONS

Extended European Search Report dated Jul. 15, 2024, issued by the European Patent Office in European Application No. 24154361.0.

* cited by examiner

*Primary Examiner* — Michelle Mandala
(74) *Attorney, Agent, or Firm* — Myers Bigel, P.A.

(57) ABSTRACT

Provided is a semiconductor device which includes: a backside contact plug, formed at a back side of the semiconductor device, below a source/drain region connected to the backside contact plug, wherein the backside contact plug includes a 1$^{st}$ portion which is not vertically overlapped by the circuit element.

20 Claims, 16 Drawing Sheets

FIG. 1A
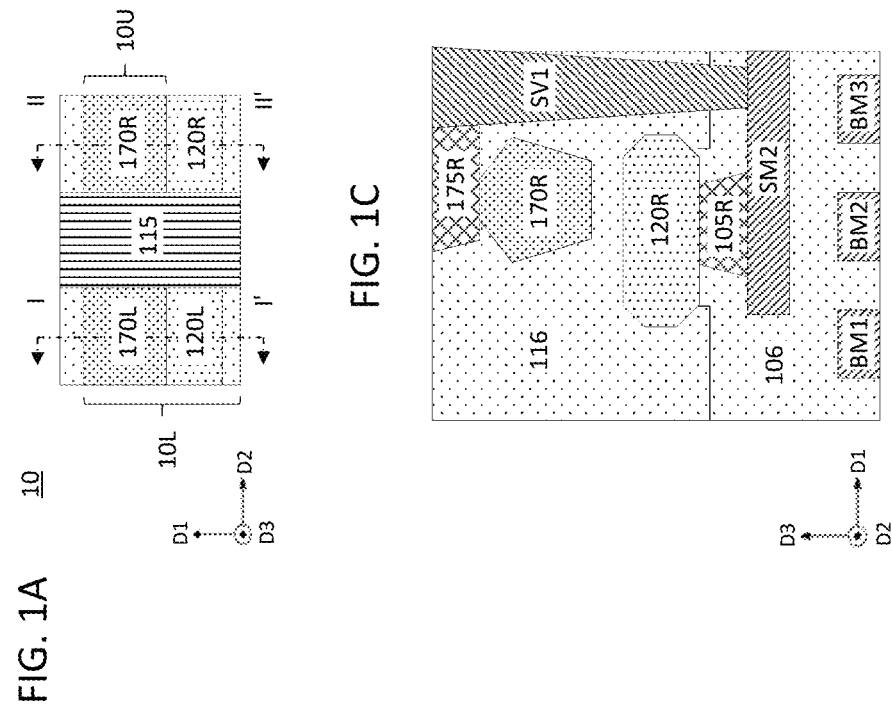
FIG. 1C
FIG. 1B
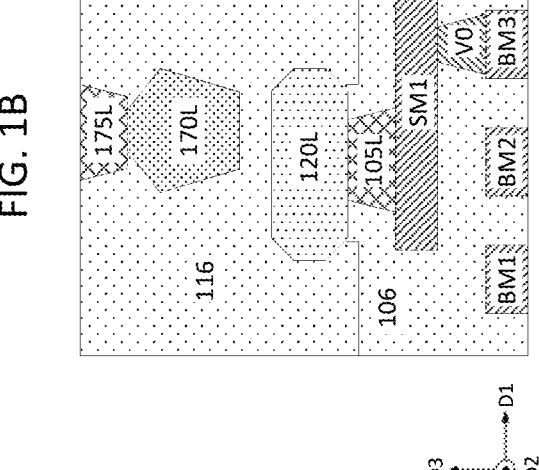

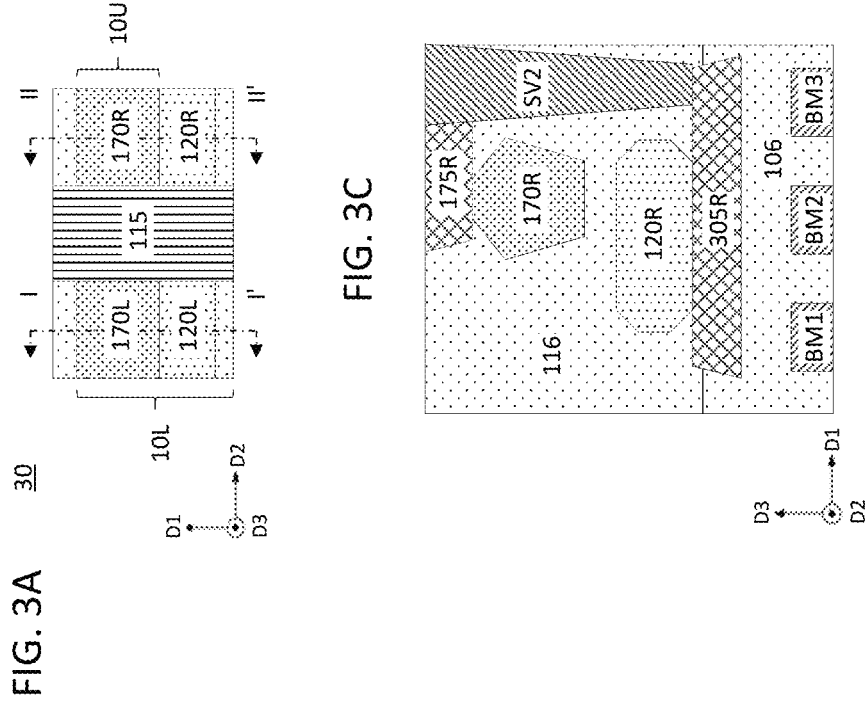
FIG. 3A
FIG. 3C
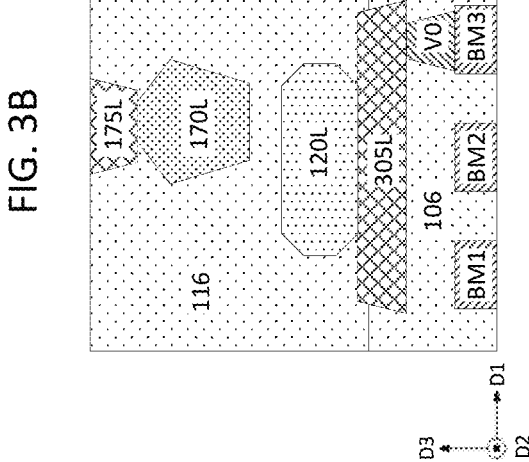
FIG. 3B

60

60

60

SEMICONDUCTOR DEVICE INCLUDING EXTENDED BACKSIDE CONTACT STRUCTURE

CROSS-REFERENCE TO RELATED APPLICATION

This application is based on and claims priority from U.S. Provisional Application No. 63/448,513 filed on Feb. 27, 2023 in the U.S. Patent and Trademark Office, the disclosure of which is incorporated herein in its entirety by reference.

BACKGROUND

1. Field

Apparatuses consistent with example embodiments of the disclosure relate to a semiconductor device including an extended backside contact structure provided at a back side of a semiconductor device.

2. Description of Related Art

Growing demand for an integrated circuit having a high device density and performance has introduced a backside power distribution network (BSPDN) formed at a back side of a semiconductor device. The BSPDN provides a backside contact plug connecting a circuit element such as a source/drain region of a transistor to a voltage source or another circuit element through a backside metal line and/or via formed in a backside isolation structure. A backside contact plug formed on a bottom surface of a circuit element such as the source/drain region may be referred to as a direct backside contact plug.

However, in implementing a high-density device structure such as a three-dimension stacked field-effect transistor (3DSFET) device, precise control to align and connect a backside contact plug with an interconnect structure such as a backside via or a backside metal line is very difficult. Thus, in order to facilitate alignment or connection with the backside contact plug, an additional metal line may be formed between the backside contact plug and the interconnect structure.

FIG. 1A is a top plan view of a 3DSFET device, and FIGS. 1B and 1C are cross-section views of the 3DSFET device of FIG. 1A along lines I-I' and II-II', respectively. It is to be understood here that FIG. 1A is provided only to show a positional relationship of source/drain regions and a gate structure of the 3DSFET in a top plan view, contact structures are not shown therein.

Referring to FIGS. 1A-1C, a 3DSFET device 10 includes a lower field-effect transistor 10L and an upper field-effect transistor 10U stacked above the lower field-effect transistor 10L. The lower field-effect transistor 10L includes a $1^{st}$ lower source/drain region 120L and a $2^{nd}$ lower source/drain region 120R connected to each other through a lower channel structure surrounded by a gate structure 115. Similarly, the upper field-effect transistor 10U includes a $1^{st}$ upper source/drain region 170L and a $2^{nd}$ upper source/drain region 170R connected to each other thorough an upper channel structure surrounded by the gate structure 115. Each of these source/drain regions may be doped with one or more of p-type or n-type impurities. The p-type impurities include boron (B), gallium (Ga), etc., and the n-type impurities include phosphorous (P), arsenic (As), indium (In), etc. The gate structure 115 may include a lower gate structure and an upper gate structure respectively surrounding the lower channel structure and the upper channel structure and isolated from each other.

Herein, each of the lower and upper field-effect transistors 10L and 10U may be a nanosheet transistor, a fin field-effect transistor (FinFET), or another type of field-effect transistor, not being limited thereto. The nanosheet transistor, also referred to as gate-all-around (GAA) transistor or multi-bridge channel field-effect transistor (MBCFET), is characterized by one or more nanosheet layers vertically stacked on a substrate as a channel structure, and a gate structure surrounding all four surfaces of each of the nanosheet channel layers. The FinFET has one or more horizontally arranged vertical fin structures as a channel structure of which at least three surfaces are surrounded by a gate structure.

In the 3DSFET device 10, the upper source/drain regions 170L and 170R may be formed to have a smaller width than the lower source/drain regions 120L and 120R, so that the 3DSFET device 10 may have a step structure. This step structure may facilitate formation of a contact plug on a top surface of a lower source/drain region through a space above the lower source/drain region not overlapped by a smaller-width source/drain region. However, the formation of the contact plug on the top surface of the lower source/drain region may be still challenging because of a high-density requirement for the 3DSFET device. Thus, even in this step-structured 3DSFET device, a backside contact plug may be usefully considered for connection of the lower source/drain region.

FIG. 1B shows that the 3DSFET device 10 further includes a plurality of backside metal lines BM1 to BM3 and a $1^{st}$ backside contact plug 105L at a back side of the 3DSFET device 10. The $1^{st}$ backside contact plug 105L may be formed on a bottom surface of the $1^{st}$ lower source/drain region 120L of the lower field-effect transistor 10L. The 3DSFET device 10 also includes a $1^{st}$ frontside contact plug 175L formed on the $1^{st}$ upper source/drain region 170L of the upper field-effect transistor 10U. The $1^{st}$ backside contact plug 105L and the $1^{st}$ front contact plug 175L may be respectively formed in a backside isolation structure 106 and a frontside isolation structure 116, respectively.

The $1^{st}$ backside contact plug 105L may connect the bottom surface of the $1^{st}$ lower source/drain region 120L to the backside metal line BM3 through a backside via V0. However, in order to compensate for misalignment of the backside via V0 with the $1^{st}$ backside contact plug 105L, a $1^{st}$ additional metal line SM1 may be required between the backside via V0 and the $1^{st}$ backside contact plug 105L as shown in FIG. 1B.

FIG. 1C shows that the 3DSFET device 10 further includes a $2^{nd}$ backside contact plug 105R at the back side of the 3DSFET device 10. The $2^{nd}$ backside contact plug is formed on a bottom surface of the $2^{nd}$ lower source/drain region 120R of the lower field-effect transistor 10L. The 3DSFET device 10 also includes a $2^{nd}$ front contact plug 175R formed on the $2^{nd}$ upper source/drain region 170R of the upper field-effect transistor 10U. The $2^{nd}$ backside contact plug 105R and the $2^{nd}$ front contact plug 175R may also be respectively formed in the backside isolation structure 106 and the frontside isolation structure 116. The $2^{nd}$ backside contact plug 105R may connect the bottom surface of the 2nd lower source/drain region 120R to the $2^{nd}$ frontside contact plug 175R through a front-to-backside via SV1. However, for the connection of the $2^{nd}$ backside contact plug 105R to the front-to-backside via SV1, a $2^{nd}$ additional metal line SM2 may be formed on a bottom surface of the $2^{nd}$ backside contact plug 105R.

Thus, in the 3DSFET device 10 shown in FIGS. 1A-1C, an additional backside metal layer to accommodate the additional metal lines SM1 and SM2 may be required under the backside contact plugs 105L and 105R to connect the backside contact plugs 105L and 105R to other circuit elements, which would result in an increased size of a 3DSFET device, and add more difficulties in implementing a BSPDN structure for the 3DSFET device.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

Various example embodiments provide a semiconductor device including an extended backside contact plug connected to a circuit element such as a source/drain region of a transistor structure, and a method of manufacturing the same.

According to embodiments, there is provided a semiconductor device which may include: a backside contact plug, formed at a back side of the semiconductor device, below a source/drain region connected to the backside contact plug, wherein the backside contact plug includes a $1^{st}$ portion which is not vertically overlapped by the circuit element.

According to an embodiment, the semiconductor device may further include a backside isolation structure which surrounds the backside contact plug including the $1^{st}$ portion.

According to an embodiment, the semiconductor device may further include a shallow trench isolation (STI) structure at a side of and above the backside contact plug.

According to an embodiment, there is provided a semiconductor device which may include: a backside contact plug, formed at a back side of the semiconductor device, below a source/drain region connected to the backside contact plug; a backside isolation structure surrounding the backside contact plug; a plurality of backside metal lines of which a backside metal line is connected to the backside contact plug, wherein the backside metal lines are arranged in a channel-width direction and extended in a channel-length direction, and wherein the backside metal lines are vertically overlapped by the backside contact plug in a cross-section view in the channel-width direction.

According to an embodiment, the backside contact plug includes an extended portion which is not vertically overlapped by the source/drain region.

According to embodiments, there is provided a method of manufacturing a semiconductor device. The method may include: providing a transistor structure including a channel stack on a substrate; forming a dummy pattern at a side of a portion of the substrate vertically overlapped by the channel stack such that the dummy pattern is not vertically overlapped by the channel stack; forming a $1^{st}$ recess, in the substrate, below a space where a source/drain region is to be formed; forming a source/drain region on the channel stack above the $1^{st}$ recess; opening the $1^{st}$ recess from a bottom thereof and removing the dummy pattern to form a $2^{nd}$ recess; and filling the $2^{nd}$ recess with a backside contact plug connected to the source/drain region such that the backside contact plug includes an extended portion, corresponding to the dummy pattern, which is not vertically overlapped by the channel stack.

Due to the extended backside contact plug described in the embodiments, the semiconductor device may achieve a reduced size and contact resistance at the extended backside contact plug in addition to manufacturing flexibility thereof.

BRIEF DESCRIPTION OF DRAWINGS

Example embodiments of the disclosure will be more clearly understood from the following detailed descriptions taken in conjunction with the accompanying drawings in which:

FIGS. 1A-1C illustrate a 3DSFET device including a backside contact plug;

FIGS. 3A-3C illustrate show a 3DSFET device including an extended backside contact plug, according to another embodiment;

DETAILED DESCRIPTION OF EMBODIMENTS

Figures 2A, 2B, 2C:
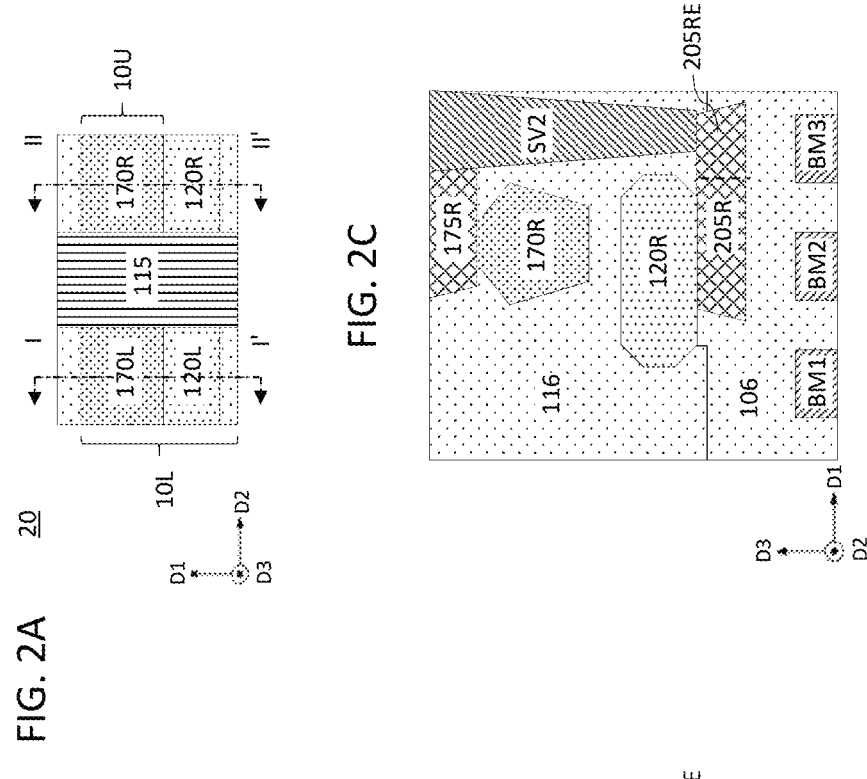
FIGS. 2A-2C illustrate a 3DSFET device including an extended backside contact plug, according to an embodiment.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be also understood that, even if a certain step or operation of manufacturing an apparatus or structure is described later than another step or operation, the step or operation may be performed later than the other step or operation unless the other step or operation is described as being performed after the step or operation. Further, functions, operations or steps described in a particular block may occur in a different way from a flow described in a flowchart. For example, two consecutive blocks may be performed simultaneously, or the blocks may be performed in reverse according to related functions, operations or steps.

It will be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor and materials forming the same may or may not be described in detail herein. For example, a certain isolation layer or structure of a semiconductor device and materials forming the same may be omitted herein when this layer or structure is not related to the novel features of the embodiments.

FIG. 2A is a top plan view of a 3DSFET device according to an embodiment, and FIGS. 2B and 2C are cross-section views of the 3DSFET device of FIG. 2A along lines I-I' and II-II', respectively.

Referring to FIGS. 2A-2C, a 3DSFET device 20 includes the same lower field-effect transistor 10L and upper field-effect transistor 10U as those of the 3DSFET device 10 shown in FIGS. 1A-1C. Thus, duplicate descriptions thereof are omitted herein.

Compared to the 3DSFET device 10, the 3DSFET device 20 is characterized by a $1^{st}$ backside contact plug 205L and a $2^{nd}$ backside contact plug 205R which are extended in a D1 direction. The D1 direction refers to a channel-width direction (or a source/drain-width direction), horizontally intersecting a D2 direction, which is a channel-length direction (or a source/drain-width direction), and vertically intersecting a D3 direction. For example, the backside contact plugs 205L and 205R may be extended to the right in the D1 direction to have extended portions 205LE and 205RE that are not vertically overlapped by the lower source/drain regions 120L and 120R, respectively.

The $1^{st}$ backside contact plug 205L may be formed to contact the bottom surface of the $1^{st}$ lower source/drain region 120L. The backside via V0 may be connected to an extended portion 205LE of the $1^{st}$ backside contact plug 205L which is not vertically overlapped by the lower source/drain region 120L so that the $1^{st}$ lower source/drain region 120L may be connected to the backside metal line BM3 through the $1^{st}$ backside contact plug 205L and the backside via V0. Thus, the additional metal line SM1 included in the 3DSFET device 10 may not be required in the 3DSFET device 20. Similarly, the $2^{nd}$ backside contact plug 205R may be formed to contact the bottom surface of the $2^{nd}$ lower source/drain region 120R. A front-to-backside via SV2 may be connected to an extended portion 205RE of the $2^{nd}$ backside contact plug 205R which is not vertically overlapped by the lower source/drain region 125R. Thus, the additional metal line SM2 included in the 3DSFET device 10 may not be required in the 3DSFET device 20.

Further, as each of the backside contact plugs 205L and 205R is extended to vertically overlap at least two backside metal lines BM2 and BM3, any one of the two backside metal lines BM2 and BM3 may be vertically connected to each of the backside contact plugs 205L and 205R without the additional metal line SM1. Moreover, the front-to-backside via SV2 may have a smaller height and a lower aspect ratio than the front-to-backside via SV1 because the additional metal line SM2 is not formed in the 3DSFET device 20.

Thus, an additional backside metal layer to accommodate the additional metal lines SM1 and SM2 may not be required in the 3DSFET device 20 to connect the backside contact plugs 105L and 105R to other circuit elements, which would result in an reduced size of a 3DSFET device and manufacturing flexibility of the 3DSFET device. Further, contact resistance at the backside contact plugs 105L and 105R may be reduced due to the increased size thereof.

In the above embodiment, the backside contact plugs 205L and 205R are extended to the right in the D1 direction. However, the disclosure is not limited thereto, and the backside contact plugs 205L and 205R may be formed to be extended to the left or to the left and right in the D1 direction according to embodiments. For example, FIGS. 3A-3C show a 3DSFET device 30 having the same structure as the 3DSFET device 20 except that $1^{st}$ and $2^{nd}$ backside contact plugs 305L and 305R are extended to the left and right in the D1 direction.

In the above embodiments, the extended backside contact plugs 205L and 305L are formed to be connected to the backside metal line BM through the backside via V0. However, the disclosure is not limited thereto. According to an embodiment, the backside contact plugs 205L and 305L may be formed to be aligned and connected to a backside metal line without a backside via therebetween.

In the above embodiments, the extended backside contact plugs 205L, 205R, 305L and 305R are formed on the 3DSFET devices 20 and 30, respectively, having a step structure in which the upper source/drain region 170L and 170R have a smaller width than the lower source/drain regions 120L and 120R. However, the disclosure is not limited thereto, and the extended backside contact plugs 205L, 205R, 305L and 305R may also be formed in a 3DSFET device in which a lower source/drain region and an upper source/drain region have the same or the substantially same width, according to an embodiment. Further, the extended backside contact plugs 205L and 205R may be formed in a single-stack field-effect transistor device, according to an embodiment.

Herebelow, methods of manufacturing a 3DSFET device including an extended backside contact plug are provided in reference to FIGS. 4A-4I to 7A-7H, according to embodiments.

Figure 4C:
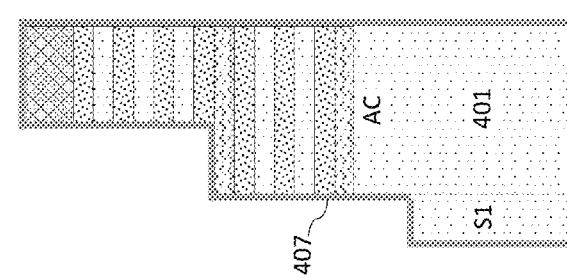
FIGS. 4A-4I illustrate transistor structures after respective steps in a process of manufacturing a 3DSFET device including an extended backside contact plug, according to an embodiment.
Figure 4B:
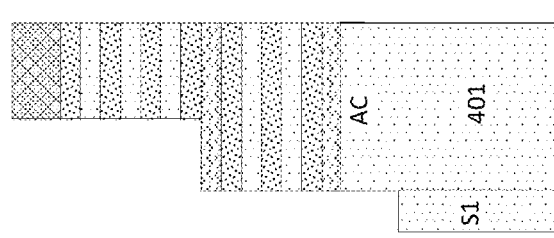
Figure 4A:
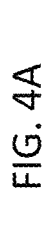
Figure 4A:
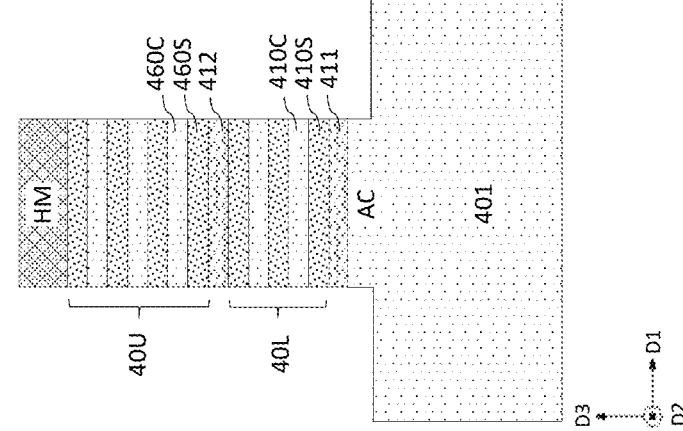
Figure 4F:
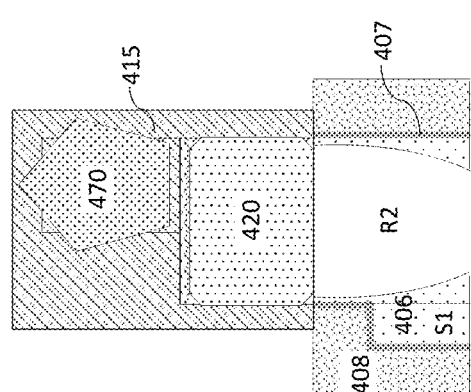
Figure 4E:
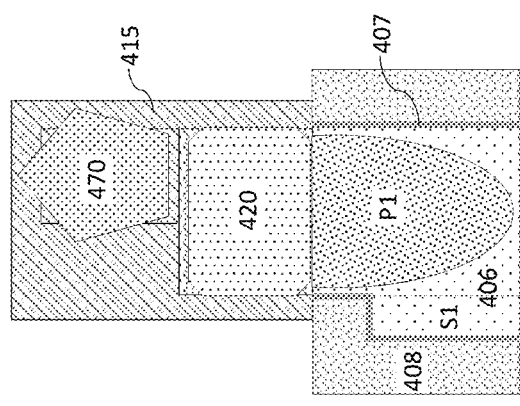
Figure 4D:
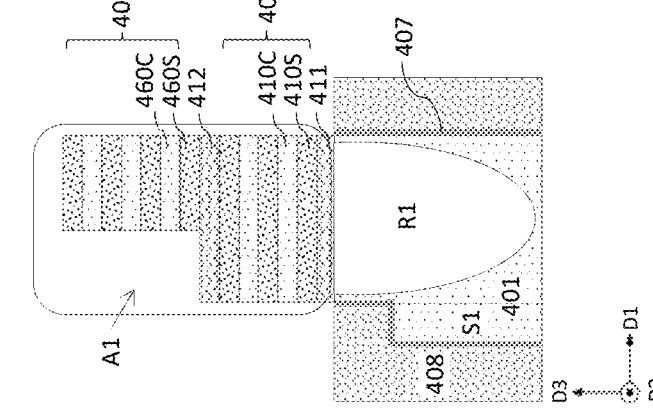
Figure 4I:
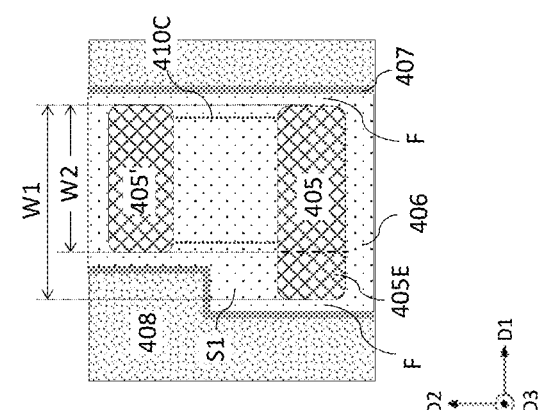

FIGS. 4A-4I illustrate transistor structures after respective steps in a process of manufacturing a 3DSFET device including an extended backside contact plug, according to embodiments. It is understood here that FIGS. 4A-4H are cross-section views of the transistor structures in the D1 direction, which is a channel-width direction, and FIG. 4I is a bottom plan view of the transistor structure shown in FIG. 4H.

Referring to FIG. 4A, a transistor structure 40 may include a lower nanosheet stack 40L for a lower field-effect transistor on an active pattern AC of a substrate 401, and an upper nanosheet stack 40U for an upper field-effect transistor stacked above the lower nanosheet stack 40L. The nanosheet stacks 40L and 40U may both be extended in the D2 direction.

A $1^{st}$ isolation layer 411 may be formed between the active pattern AC and the lower nanosheet stack 40L, and a $2^{nd}$ isolation layer may be formed between the lower nanosheet stack 40L and the upper nanosheet stack 40U. On a top surface of the upper nanosheet stack 40U may be formed a hard mask pattern HM which is used to obtain the nanosheet stacks 40L and 40U therebelow and remains there.

The nanosheet stacks 40L and 40U with the isolation layers 411 and 412 may have been epitaxially grown from the substrate 401. The lower nanosheet stack 40L may include a plurality of lower sacrificial layer 410S and lower channel layers 410C alternatingly stacked on the isolation layer 411 and extending in the D2 direction, and the upper nanosheet stack 40U may include a plurality of upper sacrificial layers 460S and upper channel layers 460C alternatingly stacked on the isolation layer 412 and extending in the D2 direction. The lower and upper sacrificial layers 410S and 460S are to be removed and replaced by lower and upper gate structures, respectively, in a later step of manufacturing a 3DSFET device from the transistor structure 40. The lower and upper channel layers 410C and 460C are to form lower and upper channel structures of a 3DSFET device to be completed based on the transistor structure 40.

The substrate 401 may be a silicon (Si) substrate, not being limited thereto. The sacrificial layers 410S and 460S may be formed of silicon germanium (SiGe), and the channel layers 410C and 460C may be formed of silicon (Si), not being limited thereto. The isolation layers 411 and 412 may be formed of a material including silicon nitride (e.g., SiN, $Si_3N_4$, SiCN, SiBCN, etc.).

Referring to FIG. 4B, the transistor structure 40 obtained in the previous step may be patterned such that the upper nanosheet stack 40U has a smaller width than the lower nanosheet stack 40L in the D1 direction. The upper nanosheet stack 40U may be formed to have a smaller width than the lower nanosheet stack 40L so that a lower source/drain region to be epitaxially grown from the lower channel layers 410C may also have a smaller width than an upper source/drain region to be epitaxially grown from the upper channel layers 460C. Thus, when the transistor structure 40 is completed as a 3DSFET device, a contact plug for the lower source/drain region may be formed on a top surface of the lower source/drain region where the lower source/drain region is not vertically overlapped by the upper source/drain region.

FIG. 4B also shows that the substrate 401 may be patterned such that a dummy pattern S1 is formed in the substrate 401 at a region in the substrate 401 not vertically overlapped by the lower nanosheet stack 40L and a top surface of the dummy pattern S1 is lower than a level of a top surface of the active pattern AC of the substrate 401. The dummy pattern S1 is to be used as a placeholder for an extension portion of a contact plug to be formed below a lower source/drain region in a later step. The patterning of the upper nanosheet stack 40U and the substrate 401 to form the dummy pattern S1 may be formed through, for example, a photolithography and etching operation, not being limited thereto.

For the formation of the dummy pattern S1, the substrate 401 may be patterned along the D1 and D3 directions. The substrate 401 may be further patterned along the D2 direction to form the dummy pattern S1.

Referring to FIG. 4C, a shallow trench isolation (STI) liner 407 may be formed to surround the transistor structure 40 including the dummy pattern S1 obtained in the previous step to isolate the transistor structure 40 from an STI structure to be formed in a next step and improve adhesion of the STI structure to the substrate 401. The STI liner 407 may be referred to as a part of the STI structure. The STI liner 407, which may include silicon nitride (e.g., SiN, $Si_3N_4$, etc.), may be formed through, for example, atomic layer deposition (ALD), not being limited thereto.

Referring to FIG. 4D, an STI structure 408 may be formed at both sides, in the D1 direction, of the substrate 401 including the dummy pattern S1 with the STI liner 407 therebetween. Thus, a 3DSFET device to be formed later from the transistor structure 40 may be isolated from another device such as another 3DSFET device adjacent to the 3DSFET device in the D1 direction, by the STI structure 408. The STI structure 408 may also be formed on the top surface of the dummy pattern S1 so that a portion of a backside contact plug to be formed in a region of the dummy pattern S1 in a later step may be isolated from another circuit element formed in that direction.

Further, the transistor structure 40 may be patterned along the D2 direction to provide a space A1, where lower and upper source/drain regions are to be formed in a next step, between the patterned transistor structures arranged in the D2 direction. In addition, a recess R1 may be formed in the substrate 401 below the space A1 where a placeholder structure for a backside contact plug is to be formed in a next step.

A material forming the STI structure 408 may include silicon oxide (e.g., SiO, SiO2, etc.) or silicon nitride (e.g., SiN, $Si_3N_4$, etc.), not being limited thereto. The STI structure 408 may be formed through, for example, chemical vapor deposition (CVD), plasma enhanced CVD (PECVD), physical vapor deposition (PVD), or a combination thereof, not being limited thereto. The patterning operation to form the recess R1 may be, for example, a photolithography and etching operation. In this step, the STI liner 407 surrounding the nanosheet stacks 40L and 40U above the STI structure 408 may be stripped away leaving the STI liner 407 between the substrate 401 and the STI structure 408.

Referring to FIG. 4E, a placeholder structure P1 for a backside contact plug may be filled in the recess R1, and a lower source/drain region 420 and an upper source/drain region 470 may be formed on the placeholder structure P1. The lower and upper source/drain regions 420 and 470 may be epitaxially grown from the lower and upper channel layers 410C and 460C, respectively. The lower and upper source/drain regions 420 and 470 may be formed in the space A1 provided by the patterning of the lower and upper nanosheet stacks 40L and 40U in the previous step. Further, a gate structure 415 may replace at least the lower and upper sacrificial layers 410S and 460S to surround the lower and upper channel layers 410C and 460C. The gate structure 415 may include a lower gate structure and an upper gate structure respectively surrounding the lower and upper channel layers 410C and 460C and isolated from each other.

In addition, the substrate 401 at D1- and D2-direction sides of the placeholder structure P1 and below the placeholder structure P1 may be removed and replaced by a backside isolation structure 406. At this time, the dummy pattern S1 may also be removed and replaced by the backside isolation structure 406. As the substrate 401 including the dummy pattern S1 is removed to be replaced by the backside isolation structure 406, the backside isolation structure 406 may also include the same dummy pattern S1.

The backside isolation structure 406 may include silicon oxide (e.g., SiO, $SiO_2$, etc.), not being limited thereto. The placeholder structure P1 may include a material such as silicon germanium (SiGe) that has etch selectivity against silicon oxide (e.g., SiO, SiO2, etc.) forming the backside isolation structure 406 and silicon oxide (e.g., SiO, SiO2, etc.) or silicon nitride (e.g., SiN, $Si_3N_4$, etc.) forming the STI structure 408 when an etchant such as a mixture of nitric acid and hydrofluoric acid is used to etch the placeholder structure P1 in a next step.

The formation of the placeholder structure P1 may be performed through, for example, CVD, PECVD, PVD, or a combination thereof, not being limited thereto. The removal and replacement of the substrate 401 may be performed by flipping upside down the transistor structure 40.

Referring to FIG. 4F, a backside of the transistor structure 40 may be planarized through, for example, chemical mechanical planarization (CMP), not being limited thereto. Subsequently, the placeholder structure P1 may be removed through, for example, dry and/or wet etching to obtain a recess R2 in the backside isolation structure 406 to expose a bottom surface of the lower source/drain region 420.

At this time, the backside isolation structure 406 may still remain at both D1- and D2-direction sides of the recess R2.

Figure 4H:
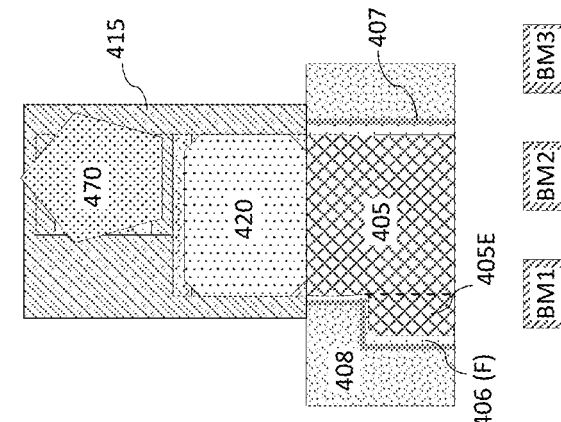
Figure 4G:
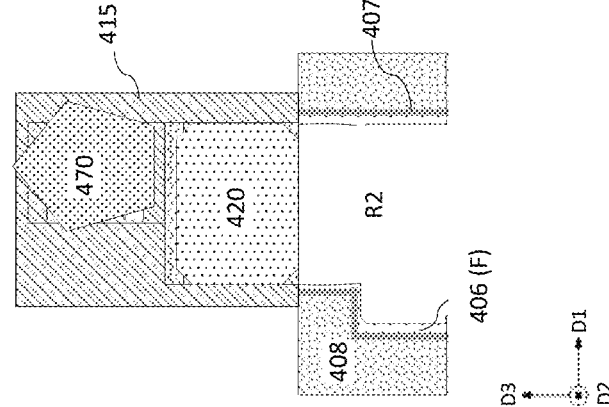

Referring to FIG. 4G, the recess R2 obtained in the previous step may be extended in the D1 and D2 directions through, for example, additional dry and/or wet etching on the backside isolation structure 406 such that a substantial portion of the backside isolation structure 406 including the dummy pattern S1 is removed. By this etching operation, an extended recess R2 may be obtained to include an extended portion in a region of the dummy pattern S1 and have an increased width in the D2 direction.

However, this recess extension operation may be performed such that at least a fringe portion F of the backside isolation structure 406 between the extended recess R2 and the STI liner 407 remains to isolate a backside contact plug to be formed in the extended recess R2 from the STI liner 407.

Referring to FIG. 4H, the extended recess R2 including the extended portion may be filled in with a backside contact plug 405 contacting a bottom surface of the lower source/drain region 420. The backside contact plug 405 may be formed of a metal or a metal compound of copper (Cu), aluminum (Al), tungsten (W), cobalt (Co), molybdenum (Mo), ruthenium (Ru), etc. The formation of the backside contact plug 405 in the extended recess R2 may be performed through, for example, CVD, PVD, PECVD, etc., not being limited thereto.

As the backside contact plug 405 may be formed in the extended recess R2 including the extended portion which is not vertically overlapped by the lower nanosheet stack 40L, the backside contact plug 405 may also include an extended portion 405E which is not vertically overlapped by the lower nanosheet stack 40L.

Due to the extended potion 405E, the backside contact plug 405 may vertically overlap at least two backside metal lines BM1 and BM2 among a plurality of backside metal lines BM1-BM3 arranged in the D1 direction and extended in the D2 direction. Thus, any one of the two backside metal lines BM1 and BM2 may be connected to the backside contact plug 405 in a vertical direction through a via formed therebetween.

Referring to FIG. 4I, which is a bottom plan view of the transistor structure 40 of FIG. 4H, the backside contact plug 405 and another backside contact plug 405' may be formed in the backside isolation structure 406 separated from the STI structure 408 with the STI liner 407 therebetween. This backside contact plug 405' may be formed below another lower source/drain region connected to the lower source/drain region 420 through the lower channel layers 410C to form a lower field-effect transistor of a 3DSFET device when the transistor structure 40 is completed. The backside contact plug 405' may be isolated from the backside contact plug 405 by the backside isolation structure 406.

FIG. 4I shows that the backside isolation structure 406 comprises the dummy pattern S1 which is protruded to the left in the D1 direction to enclose the extended portion 405E of the backside contact plug 405 in the D2 direction. As described in the previous steps, the backside contact plug 405 may be formed based on the dummy pattern S1 of the backside isolation structure 406, and thus, the backside contact plug 405 may include the extended portion 405E outside a profile of the lower source/drain region 420 in the D1 direction, that is, a portion not overlapped by the lower source/drain region 420 in the D3 direction. Further, due to the fringe portion F of the backside isolation structure 406 at D1-direction sides of the backside contact plug 405, the backside contact plug 405 may be further isolated from the STI liner 407 and the STI structure 408.

In contrast, the backside contact plug 405' may be formed at least without using a dummy pattern such as the dummy pattern S1 in the substrate 401, so that the backside contact plug 405' may not have an extended portion corresponding to the dummy pattern. Thus, a width W2 of the backside contact plug 405' may be smaller than a width W1 of the backside contact plug 405 in the D1 direction even if they may have the same thickness in the D2 direction. However, according to embodiments, the backside contact plug 405' may also be formed using the dummy pattern by forming a separate dummy pattern in the substrate 401 or extending the dummy pattern S1 in the D2 direction so that the backside contact plug 405' may have the same or substantially same width as the backside contact plug 405 in the D1 direction.

As described above, the backside contact plug 405 may be formed to have the extended portion 405E based on the dummy pattern S1, the backside contact plug 405 may be connected to a backside via or a backside metal line formed therebelow without an additional backside metal line, as described in reference to FIGS. 2A-2C to and 3A-3C.

In the above embodiment, the backside contact plug 405 may be extended to the left in the D1 direction due to the dummy pattern S1 formed at the left side of the substrate 401 in that direction. However, the disclosure is not limited thereto, and the dummy pattern S1 may be formed at the right side of the substrate 401, or at both sides thereof so that the backside contact plug 405 may be extended to the right side or both sides, according to embodiments.

Figure 5C:
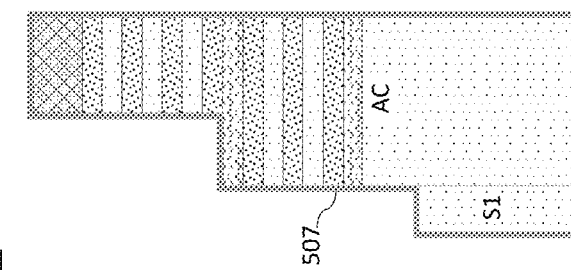
FIGS. 5A-5J illustrate transistor structures after respective steps in a process of manufacturing a 3DSFET device including an extended backside contact plug, according to another embodiment.
Figure 5B:
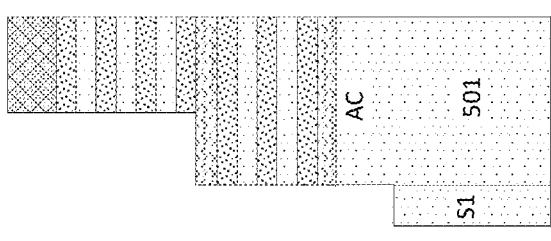
Figure 5A:
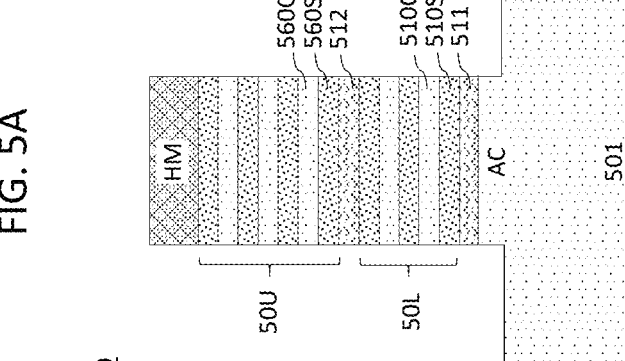
Figure 5F:
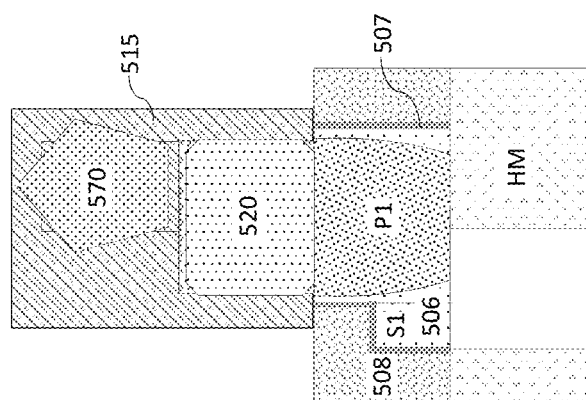
Figure 5E:
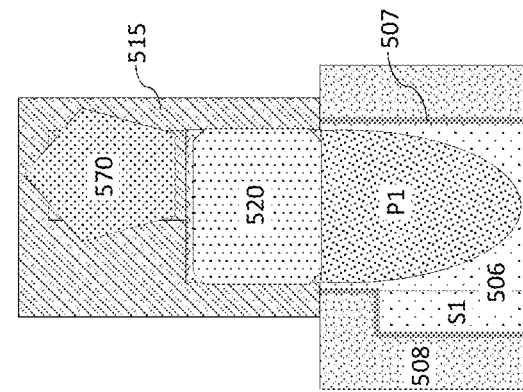
Figure 5D:
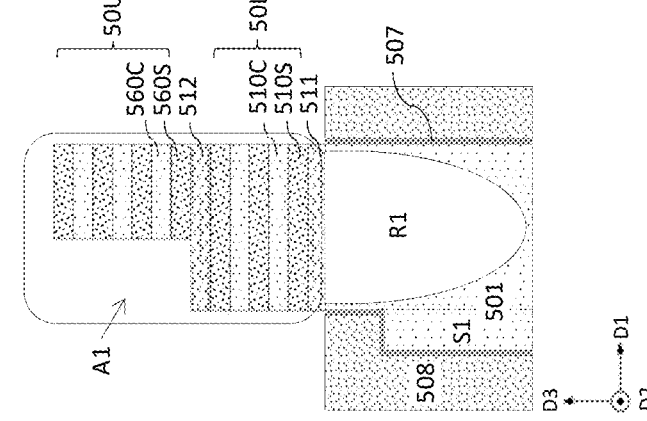
Figure 5I:
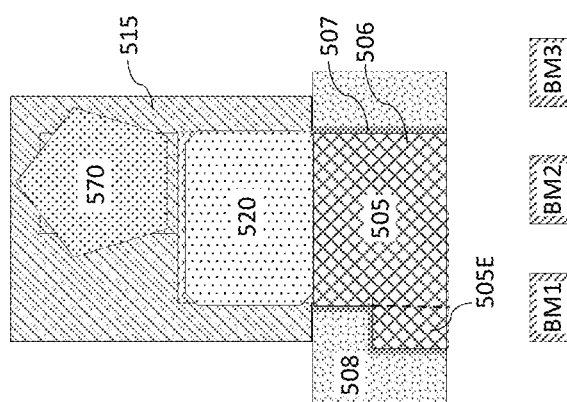
Figure 5H:
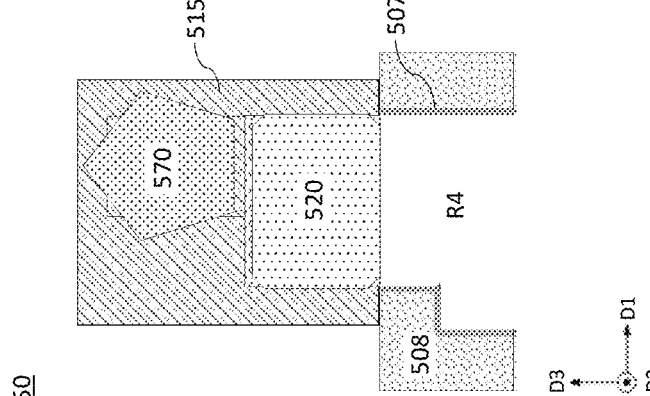
Figure 5G:
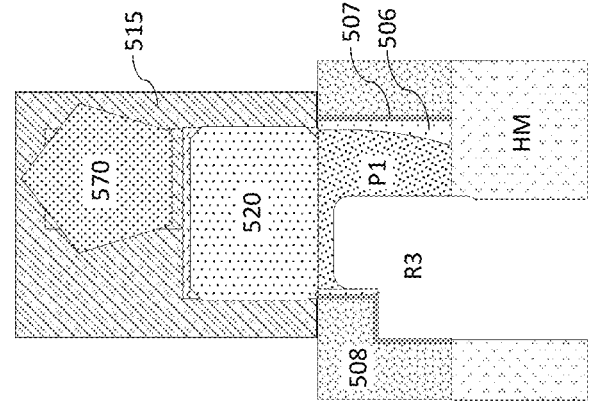
Figure 5J:
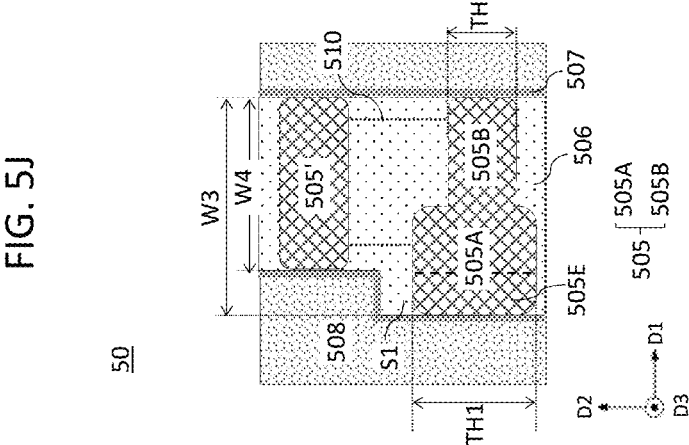

FIGS. 5A-5J illustrate transistor structures after respective steps in a process of manufacturing a 3DSFET device including an extended backside contact plug, according to another embodiment. It is understood here that FIGS. 5A-5I are cross-section views of the transistor structures in the D1 direction, which is a channel-width direction, and FIG. 5J is a bottom plan views of the transistor structure shown in FIG. 5I. It is also understood that structural elements of the transistor structures described in this embodiment and following embodiments may be the same or substantially the same as those of the transistor structures in the previous embodiment, and thus, duplicate descriptions may be omitted herebelow.

Referring to FIGS. 5A-5E, an transistor structures 50 obtained in each step may have the same structures as the transistor structures 40 obtained in each step of FIGS. 4A-4E. Thus, FIGS. 5A-5E show that a lower nanosheet stack 50L formed on a substrate 501 with a $1^{st}$ isolation layer 511 therebetween includes a plurality of alternatingly stacked lower sacrificial layers 510S and lower channel layers 510C, and an upper nanosheet stack 50U stacked above the lower nanosheet stack 50L with a $2^{nd}$ isolation layer 512 therebetween includes a plurality of alternatingly stacked upper sacrificial layers 560S and upper channel layers 560C. FIGS. 5A-5E further show that lower and upper source/drain regions 520 and 570 are formed on the lower and upper channel layers 510C and 560C surrounded by a gate structure 515, and a placeholder structure P1 is formed below the lower source/drain region 520 to be connected thereto. The placeholder structure P1 is formed in a backside isolation structure 506 with a dummy pattern S1, and an STI structure 508 is formed at sides of the backside isolation structure 506 with an STI liner 507 therebetween.

Referring to FIG. 5F, a backside of the transistor structure 50 may be planarized through, for example, CMP, not being limited thereto, to expose the placeholder structure P1. Subsequently, a photolithography operation may be performed to form a hard mask pattern HM that opens a portion of a backside of the transistor structure 50 including the dummy pattern S1 of the backside isolation structure 506.

Referring to FIG. 5G, the backside of the transistor structure 50 may be etched by, for example, dry and/or wet etching based on the hard mask pattern HM to remove the dummy pattern S1 of the backside isolation structure 506 and a left portion of the placeholder structure P1, thereby forming a recess R3. At this time, the dummy pattern S1 and the left portion of the placeholder structure P1 may be removed to the left in the D1 direction, although a portion of the dummy pattern S1 may still remain at sides thereon in the D2 direction. Thus, the recess R3 formed in the present embodiment may be different from the recess R2 formed in the previous embodiment shown in FIG. 4F.

Referring to FIG. 5H, the hard mask pattern HM used to form the recess R3 may be stripped away by an operation such as ashing, and a remaining portion of the placeholder structure P1 may be removed by, for example, additional dry and/or wet etching to extend the recess R3 obtained in the previous step in the D1 and D2 directions. The additional etching operation at this step may also remove a portion of the backside isolation structure 506 remaining at both sides of the placeholder structure P1 in the D1 direction. Due to this additional etching operation, the recess R3 obtained in the previous step may be extended to the left and right in the D1 direction to reach the STI liner 507, thereby forming an extended recess R4 exposing the STI liner 507.

As the placeholder structure P1 and the backside isolation structure 506 including the dummy pattern S1 are removed entirely in the D1 and D2 directions to obtain the extended recess R4 in this embodiment, the extended recess R4 may be wider than the extended recess R2 in the previous embodiment shown in FIG. 4G. However, the backside isolation structure 506 at D2-direction sides of the extended recess R4 may still remain, as will be described later in reference to FIG. 5J.

Referring to FIG. 5I, the extended recess R4 may be filled in with a backside contact plug 505 contacting a bottom surface of the lower source/drain region 520. The backside contact plug 505 may be formed of a metal or a metal compound of Cu, Al, W, Co, Mo, Ru, etc. The formation of the backside contact plug 505 in the extended recess R2 may be performed through, for example, CVD, PVD, PECVD, etc., not being limited thereto.

As the backside contact plug 505 may be formed in the extended recess R4 including a portion which is not vertically overlapped by the lower nanosheet stack 50L, the backside contact plug 505 may include an extended portion 505E not vertically overlapped by the lower nanosheet stack 50L.

Due to the extended potion 505E, the backside contact plug 505 may vertically overlap at least two backside metal lines BM1 and BM2 among a plurality of backside metal lines BM1-BM3 arranged in the D1 direction and extended in the D2 direction. Thus, any one of the two backside metal lines BM1 and BM2 may be connected to the backside contact plug 505 in a vertical direction through a via formed therebetween.

Referring to FIG. 5J, which is a bottom plan view of the transistor structure 50 of FIG. 5I, the backside contact plug 505 may include a $1^{st}$ portion 505A and a $2^{nd}$ portion 505B. The $1^{st}$ potion 505A may include the extended portion 505E. The $1^{st}$ portion 505A may be formed in the recess R3 obtained by the photolithography and etching operation described in reference to FIGS. 5F-5G, and the $2^{nd}$ portion 505B may be formed in a portion of the recess R4 extended to the right from the recess R3 as shown in FIGS. 5G-5H. FIG. 5J shows that the backside isolation structure 506 comprises the dummy pattern S1 which is protruded to the left in the D1 direction to enclose a part of the $1^{st}$ portion 505A of the backside contact plug 505 in the D2 direction. FIG. 5J further shows another backside contact plug 505' formed below another lower source/drain region connected to the lower source/drain region 520 through the lower channel layers 510C to form a lower field-effect transistor of a 3DSFET device when the transistor structure 50 is completed.

In the previous embodiment, the fringe portion F of the backside isolation structure 406 remains at the D1-direction sides of the backside contact plug 405 as shown in FIGS. 4H-4I. In the present embodiment, however, no fringe portion of the backside isolation structure 506 may be left at the D1 direction sides of the backside contact plug 505. This is because, as described earlier in reference to FIGS. 5G-5I, the extended recess R4, where the backside contact plug 505 is filled, may be formed such that the backside isolation structure 506 including the dummy pattern S1 may be entirely removed to the left and right sides thereof in the D1 direction. Thus, a width W3 of the backside contact plug 505 may be greater than the width W1 of the backside contact plug 405 of the previous embodiment shown in FIG. 4I.

Although the backside isolation structure 506 may not remain at the D1 direction sides of the backside contact plug 505, it may still remain at the D2 direction sides of the backside contact plug 505 to isolate the backside contact plug 505 from the other backside contact plug 505'.

In the meantime, in the present embodiment, a thickness TH1 of the $1^{st}$ portion 505A of the backside contact plug 505 may be greater than a thickness TH2 of the $2^{nd}$ portion 505B in the D2 direction. This is because the $1^{st}$ portion 505A of the backside contact plug 505 is filled in the recess R3 formed through the photolithography and etching operation as shown in FIG. 5G. While the $1^{st}$ portion 505A includes the extended portion 505E vertically not overlapped by the lower source/drain region 520, a remaining portion of the $1^{st}$ portion 505A may be vertically overlapped by the lower source/drain region 520 and have the thickness TH2 which is greater than the thickness TH1 of the $2^{nd}$ portion 505B which is also vertically overlapped by the lower source/drain region 520. Here, the $2^{nd}$ portion 505B may be referred to as a $1^{st}$ section of the non-overlapped portion of the backside contact plug 505, and the remaining portion of the $1^{st}$ portion 505A may be referred to as a $2^{nd}$ section of the non-overlapped portion of the backside contact plug 505.

Due to the above-descriptions structure of the $1^{st}$ portion 505A, the backside contact plug 505 of the present embodiment may provide a more increased contact area for connection to other circuit elements than the backside contact plug 405 having a uniform thickness along the D1 direction.

Unlike the backside contact plug 505 for the lower source/drain region 520, the backside contact plug 505' for the other lower source/drain region may be formed without using a dummy pattern such as the dummy pattern S1 for the backside contact plug 505 so that the backside contact plug 505' may not have a portion corresponding to the $1^{st}$ portion 505A of the backside contact plug 505. Thus, a width W4 of the backside contact plug 505' may be smaller than the width W3 of the backside contact plug 505 in the D1 direction even if they may have the same thickness TH2. However, according to embodiments, the backside contact plug 505' may also be formed in the same manner as the backside contact plug 505 so that the backside contact plug 505' may have the same or substantially same structural shape and dimension as the backside contact plug 505.

As described above, the backside contact plug 505 may be formed based on the dummy pattern S1 of the backside isolation structure 506, and thus, the backside contact plug 505 may include the extended portion 505E outside a profile of the lower source/drain region 520 in the D1 direction, that is, a portion not overlapped by the lower source/drain region 520 in the D3 direction. Thus, the backside contact plug 505 may be connected to a backside via or a backside metal line formed therebelow without an additional backside metal line, as described in reference to FIGS. 2A-2C to and 3A-3C.

In the above embodiment, the $1^{st}$ portion 505A of the backside contact plug 505 may be formed at the left side in the D1 direction due to the dummy pattern S1 forming a left-side portion of the substrate 501 in that direction. However, the disclosure is not limited thereto, and the dummy pattern S1 may for a right-side portion of the substrate 501, or two dummy patterns may form both sides thereof, respectively, so that the $1^{st}$ portion 505A of the backside contact plug 505 may be formed at the right side or both sides in the D1 direction, according to embodiments.

Figure 6C:
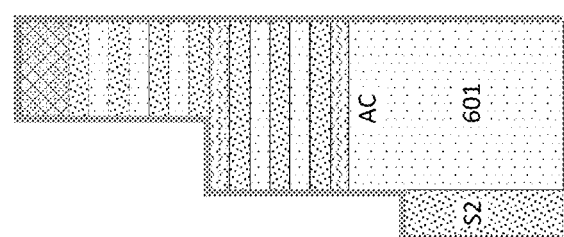
FIGS. 6A-6H illustrate transistor structures after respective steps in a process of manufacturing a 3DSFET device including an extended backside contact plug, according to still another embodiment.
Figure 6B:
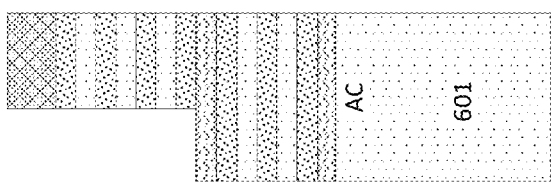
Figure 6A:
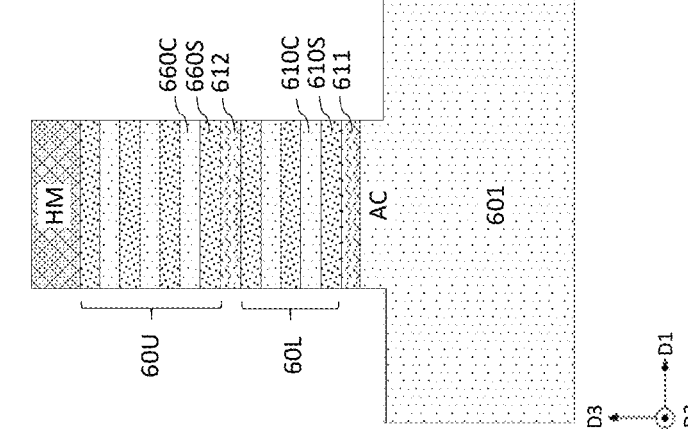
Figure 6F:
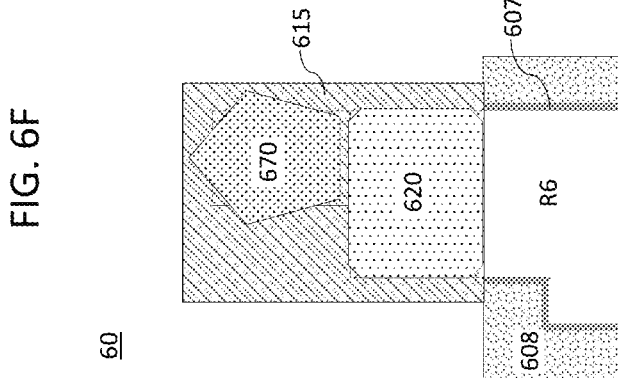
Figure 6E:
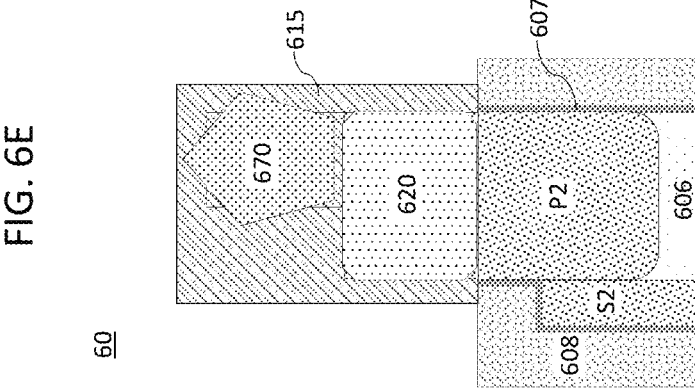
Figure 6D:
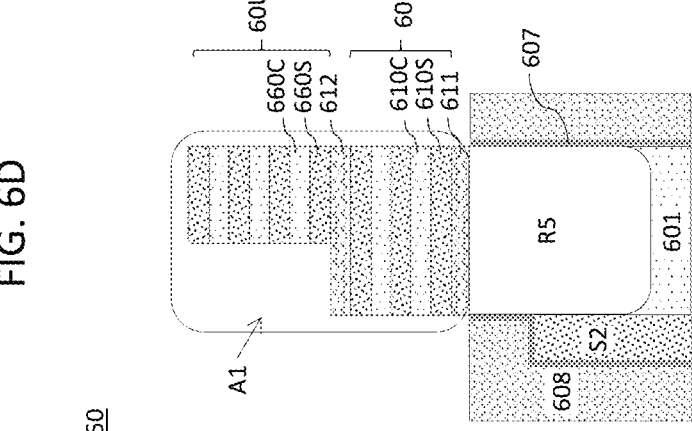
Figure 6H:
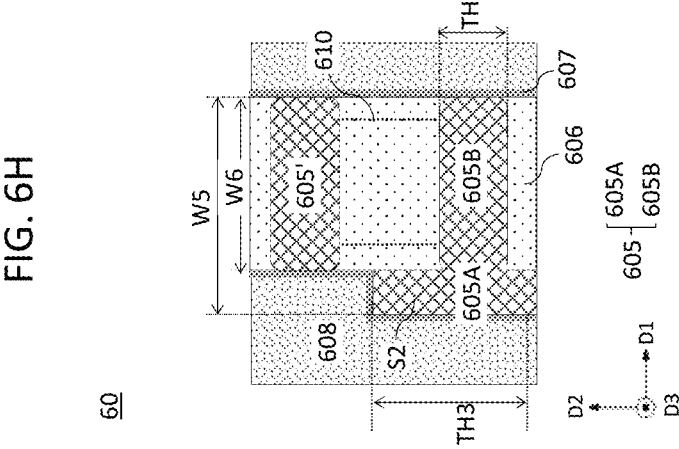

FIGS. 6A-6H illustrate transistor structures after respective steps in a process of manufacturing a 3DSFET device including an extended backside contact plug, according to still another embodiments. It is understood here that FIGS. 6A-6H are cross-section views of the transistor structures in the D1 direction, which is a channel-width direction, and FIG. 6H is a bottom plan views of the transistor structure shown in FIG. 6G.

Referring to FIG. 6A, an transistor structures 60 may have the same structure as the transistor structures 40 obtained in FIG. 4A. Thus, FIG. 6A shows that a lower nanosheet stack 60L formed on a substrate 601 with a $1^{st}$ isolation layer 611 therebetween includes a plurality of alternatingly sacrificial layers 610S and channel layers 610C, and an upper nanosheet stack 60U stacked above the lower nanosheet stack 60L with a $2^{nd}$ isolation layer 612 therebetween includes a plurality of alternatingly sacrificial layers 660S and channel layers 660C.

Referring to FIG. 6B, the transistor structure 60 obtained in the previous step may be patterned through, for example, photolithography and/or etching operations, not being limited thereto, such that the upper nanosheet stack 60U has a smaller width than the lower nanosheet stack 60L in the D1 direction, and side surfaces of the lower nanosheet stack 60L are coplanar with side surfaces of the patterned substrate 601.

Referring to FIG. 6C, a dummy pattern S2 may be formed at one side of the substrate 601 as a placeholder for an extension portion of a contact plug to be formed below a lower source/drain region in a later step. This dummy pattern S2 corresponds to the dummy pattern S1 of the previous embodiments to have the same shape as the dummy pattern S1. Thus, dummy pattern S2 may not be vertically overlapped by the lower nanosheet stack 60L and a top surface of the dummy pattern S2 may be lower than a level of a top surface of the active pattern AC of the substrate 601.

However, unlike in the dummy pattern S1 which is a part of the substrate 401 or 501 and formed of the same material forming the substrate 401 or 501, the dummy pattern S2 may be formed at the one side of the substrate 601 after patterning the substrate 601 as shown in FIG. 6B, and may be formed of a different material. For example, a material such as silicon germanium (SiGe) may be deposited to surround the transistor structure 60 including the substrate 601 as obtained in the previous step, and may be patterned to be formed at the one side of the substrate 601 as shown in FIG. 6C. This material forming the dummy pattern S2 may be different from the material forming the substrate (e.g., silicon), and instead, may be the same material forming a placeholder structure to be formed in a later step.

Further, an STI liner 507 may be formed to surround the patterned transistor structure 60 with the dummy pattern S2 to isolate an STI structure to be formed in a next step from the substrate 601 and improve adhesion of the STI structure to the substrate 601. The STI liner 407, which may include silicon nitride (e.g., SiN, $Si_3N_4$, etc.), may be formed through, for example, ALD, not being limited thereto.

Referring to FIG. 6D, an STI structure 608 may be formed at both sides of the substrate 601 with the dummy pattern S2 attached thereto, so that a 3DSFET device to be formed later from the transistor structure 60 may be isolated from an adjacent device such as another 3DSFET device by the STI structure 608. The STI structure 608 may also be formed on the top surface of the dummy pattern S2 so that a portion of a backside contact plug formed in a region of the dummy pattern S2 in a later step may be isolated from another circuit element in that direction.

Further, the transistor structure 60 may be patterned along the D2 direction to provide a space A1, where lower and upper source/drain regions are to be formed in a next step, between the patterned transistor structures arranged in the D2 direction, and a recess R5 in the substrate 601 below the space A1 where a placeholder structure for a backside contact plug is to be formed in a next step.

A material forming the STI structure 608 may include silicon oxide (e.g., SiO, SiO2, etc.) or silicon nitride (e.g., SiN, $Si_3N_4$, etc.), not being limited thereto. The STI structure 608 may be formed through, for example, CVD, PECVD, PVD, or a combination thereof, not being limited thereto. The patterning operation to form the recess R5 may be, for example, a photolithography and etching operation. In this step, the STI liner 607 surrounding the nanosheet stacks 60L and 60U above the STI structure 608 may be stripped away leaving the STI liner 607 between the substrate 601 and the STI structure 608.

In the present embodiment, the recess R5 formed in the substrate 601 may have a different shape from the recess R1 in the substrate 401 in the previous embodiment referring back to FIG. 4D. For example, the recess R5 shown in FIG. 6D may have a rectangle shape with rounded bottom corners while the recess R1 shown in FIG. 4D may have a half oval shape. Further, the recess R5 may be formed such that there may be no substrate 601 remaining at D1-direction sides of the recess R5 after formation thereof, and instead, the recess R5 may expose the dummy pattern S2 and the STI liners 607 at its sides. However, the substrate 601 may still remain at the D2-direction sides of the recess R5 after formation of the recess R5. As will be described later, the shape of the recess R5 in the present embodiment may enable simplification of a subsequent etching operation.

Referring to FIG. 6E, a placeholder structure P2 for a backside contact plug may be filled in the recess R5, and a lower source/drain region 620 and an upper source/drain region 670 may be formed on the placeholder structure P2. The lower and upper source/drain regions 620 and 670 may be epitaxially grown from the lower and upper channel layers 610C and 660C, respectively. The source/drain regions 620 and 670 may be formed in the space A1 provided by the patterning of the nanosheet stacks 60L and 60U in the previous step. Further, a gate structure 615 may replace at least the lower and upper sacrificial layers 610S and 660S to surround the lower and upper channel layers 610C and 660C. The gate structure 615 may include a lower gate structure and an upper gate structure respectively surrounding the lower and upper channel layers 610C and 660C and isolated from each other.

In addition, the substrate 601 below the placeholder structure P2 and at sides of the placeholder structure P2 in the D2 direction and below the placeholder structure P2 may be removed and replaced by a backside isolation structure 606 through, for example, dry and/or wet etching. The removal and replacement of the substrate 601 may be performed by flipping upside down the transistor structure 60. The backside isolation structure 606 may be formed of a material such as silicon oxide (e.g., SiO, $SiO_2$, etc.), not being limited thereto.

When the substrate 601 is removed, the dummy pattern S2 may not be removed along with the substrate 601. For example, when an etchant for wet etching to remove the substrate 601 formed of silicon (Si), the etchant may not act on the dummy pattern formed of silicon germanium (SiGe). This is different from the previous embodiment of FIGS. 4A-4I, in which the dummy pattern S1 may also be removed when the substrate 401 is removed by dry and/or wet etching because the dummy pattern S1, as a part of the substrate 401, may be formed of the same material (e.g., silicon (Si)) forming the substrate 401.

The placeholder structure P2 may include the same material forming the placeholder structure P1 in the previous embodiment, and may be formed through the same process. Thus, duplicate descriptions may be omitted herein. However, as the placeholder structure P2 may be formed by filling in the recess R5 having a rectangle shape with rounded corners, the placeholder structure P3 may have the same shape as the recess R5.

Referring to FIG. 6F, a backside of the transistor structure 60 may be planarized through, for example, CMP, not being limited thereto, to expose the placeholder structure P2 and the planarized dummy pattern S3. Subsequently, the placeholder structure P2 and the dummy pattern S2 may be removed through, for example, dry and/or wet etching to obtain a recess R6 in the backside isolation structure 606. The recess R6 may expose the STI liner 607 at both sides thereof as well as a bottom surface of the lower source/drain region 620.

In a corresponding step of the previous embodiment shown in FIGS. 4E-4G, after the transistor structure 40 is planarized at the backside thereof, and dry and/or wet etching is performed to remove the placeholder structure P1 to obtain the recess R2, an additional dry and/or wet etching operation may be performed to remove the backside isolation structure 406 including the dummy pattern S1 at the D1-direction sides of the recess R2 to obtain the extended recess R2. However, in the present embodiment, an additional etching operation to remove the backside isolation structure 606 may not be necessary. This is because no substrate 601 may remain at the sides of the recess R5, and thus, no backside isolation structure 606 replacing the substrate 601 may remain at sides of the recess R6 as shown in FIGS. 6D and 6E.

In addition, in the present embodiment, since the dummy pattern S2 may be formed of the same material, for example, silicon germanium (SiGe), that forms the placeholder structure P2, the placeholder structure P2 and the dummy pattern S2 may be removed at the same or substantially same time after the planarization of the backside of the transistor structure 60. The removal of the placeholder structure P2 and the dummy pattern S2 may be performed through, for example, dry and/or wet etching using an etchant such as a mixture of nitric acid and hydrofluoric acid that may selectively etch silicon germanium (SiGe) against silicon oxide (e.g., SiO, SiO2, etc.) forming the backside isolation structure 606 and silicon oxide (e.g., SiO, SiO2, etc.) or silicon nitride (e.g., SiN, $Si_3N_4$, etc.) forming the STI structure 608. Further, no additional etching may be required to remove the backside isolation structure 606 because the backside isolation structure 606 does not remain at the sides of the recess R6. Thus, the placeholder structure P2 and the dummy pattern S2 may be etched in a self-aligning manner.

In the present embodiment, however, the backside isolation structure 606 at D2-direction sides of the recess R6, except at D2-direction sides of a region of the recess R6 obtained by removing the dummy pattern S2, may still remain, as will be described later in reference to FIG. 6H.

As the placeholder structure P2 and the dummy pattern S2 are removed to form the recess R6 in this manner, the recess R6 obtained in this step may be wider than the extended recess R2 in the previous embodiment shown in FIG. 4G.

Figure 6G:
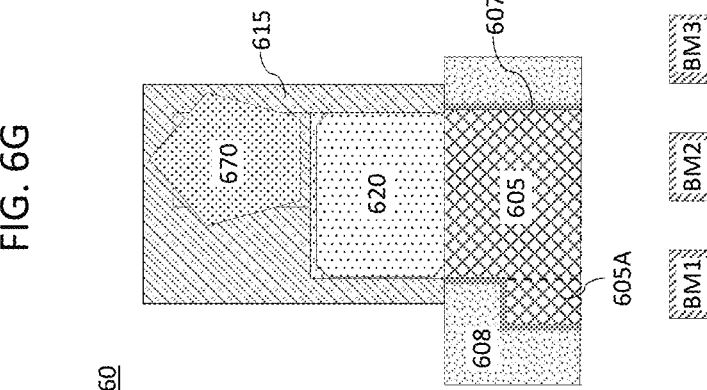

Referring to FIG. 6G, the recess R6 may be filled in with a backside contact plug 605 contacting a bottom surface of the lower source/drain region 620. The backside contact plug 605 may be formed of a metal or a metal compound of Cu, Al, W, Co, Mo, Ru, etc. The formation of the backside contact plug 605 in the recess R4 may be performed through, for example, CVD, PVD, PECVD, etc., not being limited thereto.

As the backside contact plug 605 may be formed in the recess R6 formed by removing not only the placeholder structure P2 but also the dummy pattern S2 which is not vertically overlapped by the lower nanosheet stack 60L, the backside contact plug 605 may include a $1^{st}$ portion 605A, that is, an extended portion, not vertically overlapped by the lower nanosheet stack 60L.

Due to the $1^{st}$ potion 605A, the backside contact plug 605 may vertically overlap at least two backside metal lines BM1 and BM2 among a plurality of backside metal lines BM1-BM3 arranged in the D1 direction and extended in the D2 direction. Thus, any one of the two backside metal lines BM1 and BM2 may be connected to the backside contact plug 605 in a vertical direction through a via formed therebetween.

Referring to FIG. 6H, which is a bottom plan view of the transistor structure 60 of FIG. 6I, the backside contact plug 605 may include the $1^{st}$ portion 605A and a $2^{nd}$ portion 605B. The $1^{st}$ potion 605A may be formed in a region of the recess R6 where the dummy pattern S2 is removed, and the $2^{nd}$ portion 605B may be formed in a region of the recess R6 where the backside contact plug P2 is removed as shown in FIGS. 6E-6F. FIG. 6H shows that the backside isolation structure 606 comprises the dummy pattern S1 which is protruded to the left in the D1 direction to enclose a part of the $1^{st}$ portion 505A of the backside contact plug 505 in the D2 direction. FIG. 6H further shows another backside contact plug 605' formed below another lower source/drain region connected to the lower source/drain region 620 through the channel layers 610C to form a lower field-effect transistor of a 3DSFET device when the transistor structure 60 is completed.

In the previous embodiment, the fringe portion F of the backside isolation structure 406 remains at the D1-direction sides of the backside contact plug 405 as shown in FIGS. 4H-4I. In the present embodiment, however, no fringe portion of the backside isolation structure 606 may be left at the D1-direction sides of the backside contact plug 505. This is because, as described earlier in reference to FIGS. 6D-6F, the recess R6, where the backside contact plug 605 is filled, may be formed by entirely removing the dummy pattern S2 and the placeholder structure P2 formed of the same material (e.g., SiGe). Thus, a width W5 of the backside contact plug 605 may be greater than the width W1 of the backside contact plug 405 of the previous embodiment shown in FIG. 4I.

Further, in the previous embodiments of FIGS. 4I and 5J, the dummy patterns S1 may be a part of the substrate 601, and may not be entirely removed at least in the D2 direction to form the recesses R2 and R3 shown in FIGS. 4G and 5G, respectively. Thus, the backside isolation structures 406 and 506 respectively replacing the substrates 401 and 501 may still remain at the D2-direction sides of portions of the recesses R2 and R3 formed by removing portions of the dummy patterns S1, respectively. However, in the present embodiment, the dummy pattern S2 may not be a part of the substrate 601, and may be entirely removed along with the placeholder structure P2 to form the recess R6. Thus, the $1^{st}$ portion 605A of the backside contact plug 605 may entirely fill the region of the recess R6 where the dummy pattern S2 is removed, thereby replacing the dummy region S2. Accordingly, the backside isolation structure 606 replacing the substrate 601 may not remain at the D2-direction sides of the $1^{st}$ portion 605A of the backside contact plug 605. However, the backside isolation structure 606 may still remain at the D2-direction sides of the $2^{nd}$ portion 605B of the backside contact plug 605 to isolate the backside contact plug 605 from the other backside contact plug 605'.

As the $1^{st}$ portion 605A of the backside contact plug 605 entirely fills the region of the recess R6 where the dummy pattern S2 is removed in the present embodiment, a thickness TH3 of the $1^{st}$ portion 605A of the backside contact plug 605 may be greater than a thickness TH4 of the $2^{nd}$ portion 605B in the D2 direction. Thus, the backside contact plug 605 of the present embodiment may have a more increased contact area for connection to other circuit elements than the backside contact plug 405 having a uniform thickness along the D1 direction.

Unlike the backside contact plug 605 for the lower source/drain region 620, the backside contact plug 605' for the other lower source/drain region may be formed without using a dummy pattern such as the dummy pattern S2 in the substrate 601 so that the backside contact plug 605' may not have a portion corresponding to the 1$^{st}$ portion 605A of the backside contact plug 605. Thus, a width W6 of the backside contact plug 605' may be smaller than a width W5 of the backside contact plug 605 in the D1 direction even if they may have the same thickness TH4. However, according to embodiments, the backside contact plug 605' may also be formed using a dummy pattern in the substrate 601 or extending the dummy pattern S2 in the D2 direction so that the backside contact plug 605' may have the same or substantially same width as the backside contact plug 605 in the D1 direction.

As described above, the backside contact plug 605 may be formed based on the dummy pattern S2, and thus, the backside contact plug 605 may include the 1$^{st}$ portion outside a profile of the lower source/drain region 620 in the D1 direction, that is, an extended portion not overlapped by the lower source/drain region 620 in the D3 direction. Thus, the backside contact plug 605 may be connected to a backside via or a backside metal line formed therebelow without an additional backside metal line, as described in reference to FIGS. 2A-2C to and 3A-3C.

In the above embodiment, the 1$^{st}$ portion 605A of the backside contact plug 605 may be formed at the left side in the D1 direction due to the dummy pattern S2 formed at the left side of the substrate 601 in that direction. However, the disclosure is not limited thereto, and the dummy pattern S2 may be formed at the right side of the substrate 601, or at both sides thereof so that the 1$^{st}$ portion 605A of the backside contact plug 505 may be formed at the right side or both sides in the D1 direction, according to embodiments.

In the above embodiment, the STI liner 607 may be formed between the STI structure 608 and the backside contact plugs 505 and 505' as shown in FIGS. 6G and 6H. However, the disclosure is not limited thereto. According to an embodiment, the STI liner 607 may be removed in the transistor structure 60 shown in FIGS. 6G and 6H. For example, the STI liner 607 may be formed to surround the patterned transistor structure 60 shown in FIG. 6B prior to forming the dummy pattern S2 at the left side surface of the substrate 601, and then, the STI liner 607 may be removed in the step of forming the recess R6.

In the above embodiments, each of the backside contact plugs is formed to have an extended portion which is not vertically overlapped by a lower source/drain. However, the disclosure is not limited thereto. According to embodiments, the backside contact plug may be formed to have an extended portion which is not vertically overlapped by at least one of a lower source/drain and an upper source/drain region of a 3DSFET device.

In the above embodiments, each of the backside contact plugs is formed to have an extended portion which is not vertically overlapped by a source/drain in the D1-direction cross-section view. However, the disclosure is not limited thereto. According to embodiments, the backside contact plug may be formed to have an extended portion which is not vertically overlapped by a source/drain in at least one of the D1-direction cross-section view and the D2-direction cross-section view.

In the above embodiments, each of the transistor structures forms a 3DSFET device formed of a nanosheet transistor structure in which the lower stack include a greater-width channel structure and source/drain region than the upper stack. However, according to embodiments, each of the extended backside contact plugs may also be formed for different 3DSFET devices in which the lower stack and the upper stack have the same- or substantially same-width channel structures and source/drain regions, whether the two transistors in the lower stack and a transistor are the same type or different types of transistor such as nanosheet transistor or FinFET. Further, the extended backside contact plug may also be formed for a single-stack transistor device regardless of the type of transistor forming the single-stack transistor device. Moreover, the extended backside contact plug may also be formed below another circuit element of a semiconductor device such as a doped region (P region or N region) of a passive device such as a PN junction diode at a back side thereof.

Figure 8:
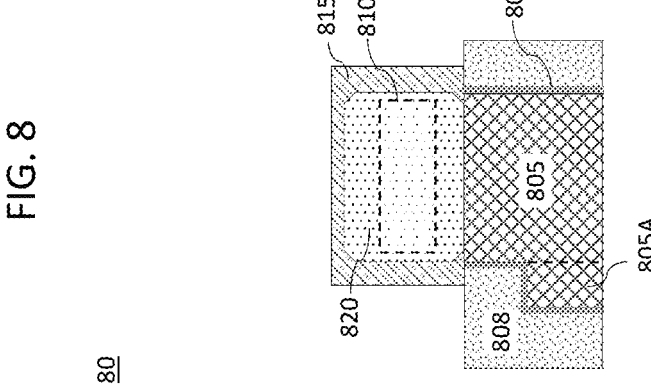
FIGS. 7 and 8 illustrate various semiconductor devices, each including an extended backside contact plug, according to embodiments.
Figure 7:
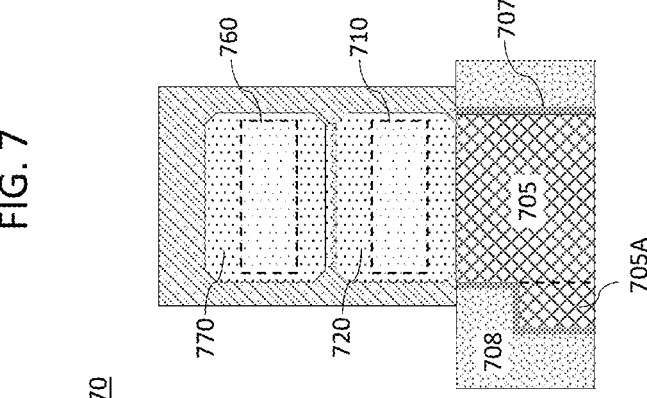

FIGS. 7 and 8 illustrate various semiconductor devices, each including an extended backside contact plug, according to embodiments.

FIG. 7 shows that a 3DSFET device 70 may include a lower-stack transistor and an upper-stack transistor having respective channel structures 710 and 760 having the same- or substantially same width, and respective source/drain regions 720 and 730 having the same- or substantially same width. Each of the channel structures 710 and 760 may include one or more nanosheet channel layers for a nanosheet transistor, vertical fin structures for a FinFET, or another type of channel structure for a different transistor, not being limited thereto.

The 3DSFET device 70 may also include a backside contact plug 705 and an STI structure 708 with the STI liner 709 thereon. The backside contact plug 705 may be isolated from adjacent circuit elements also by a backside isolation structure in additional to the STI structure 708.

Similar to the embodiments shown in FIGS. 2A-2C to 6A-6H, the backside contact plug 705 may include an extended portion 705A which is not overlapped by the lower source/drain region 720 in the D3 direction.

FIG. 8 shows that a semiconductor device 80 may include a single-stack or two-dimensional (2D) transistor including a channel structure 810 and a source/drain region 820. The channel structure 810 may include one or more nanosheet channel layers for a nanosheet transistor, vertical fin structures for a FinFET, or another type of channel structure for a different transistor, not being limited thereto.

The semiconductor device 80 may also include a backside contact plug 805 and an STI structure 808 with the STI liner 809 thereon. The backside contact plug 805 may be isolated from adjacent circuit elements also by a backside isolation structure in additional to the STI structure 808.

Similar to the embodiments shown in FIGS. 2A-2C to 6A-6H, the backside contact plug 805 may include an extended portion 805A which is not overlapped by the source/drain region 820 in the D3 direction.

In the embodiments described above in reference to FIGS. 7 and 8, the backside contact plugs 705 and 805 may take the structural form of not only the backside contact plug 605 but also either of the backside contact plug 405 and the backside contact plug 505 having respective extended portions.

Figure 9:
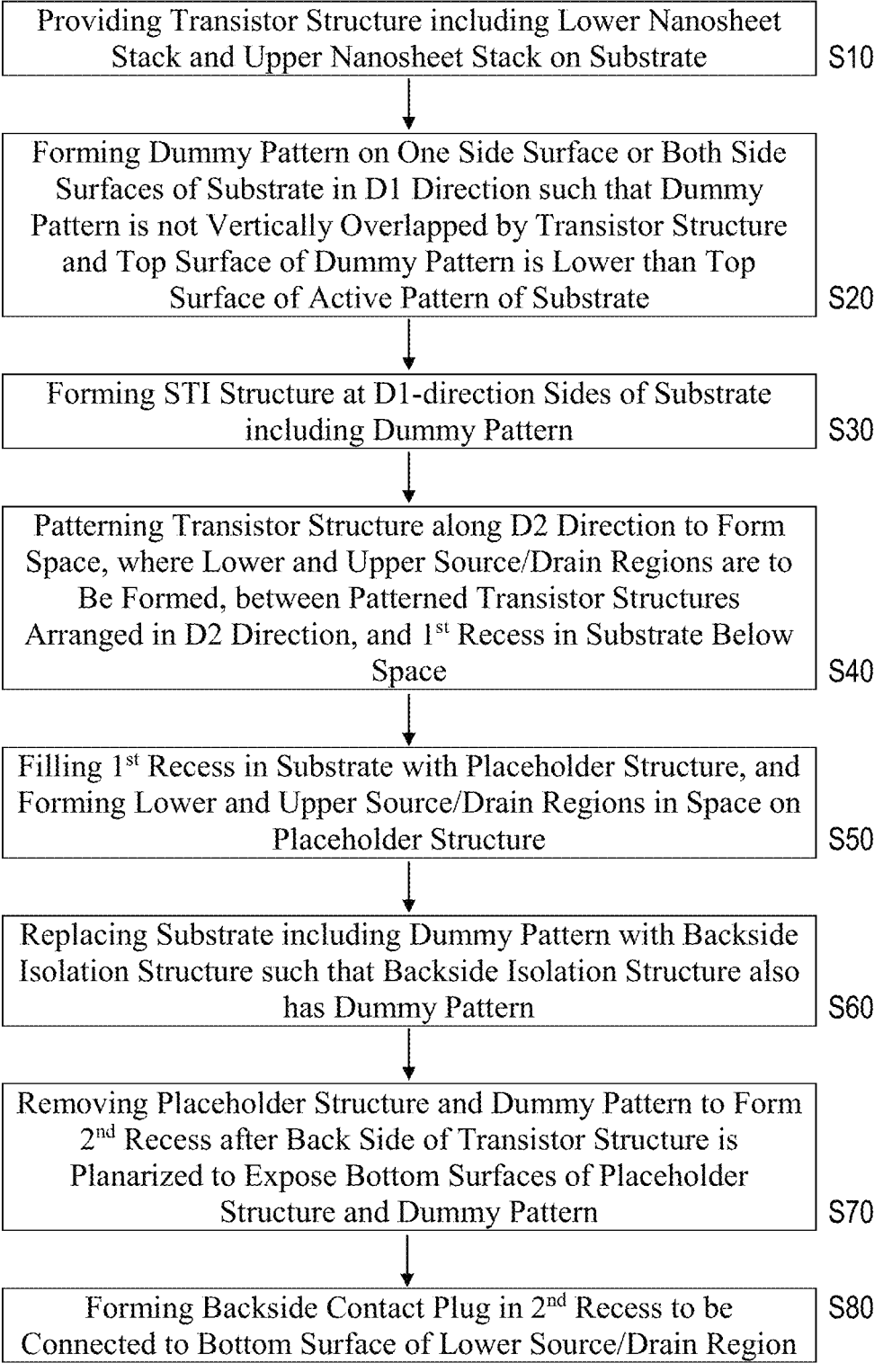
FIG. 9 illustrates a flowchart of manufacturing a 3DSFET device including an extended backside contact plug, according to an embodiment.

FIG. 9 illustrates a flowchart of manufacturing a 3DSFET device including an extended backside contact plug, according to an embodiment.

In step S1, a transistor structure including a lower nanosheet stack and an upper nanosheet stack on a substrate may be provided.

The transistor structure may include a plurality of sacrificial layers and a plurality of nanosheet channel layers alternatingly stacked and extending in the D2 direction. The sacrificial layers are to be replaced by a gate structure, and the channel layers may form lower and upper channel structures for the 3DSFET device when the transistor structure is completed as the 3DSFET device. Thus each of these nanosheet stacks may be referred to as a channel stack.

In the transistor structure, the upper stack may be patterned to have a smaller width than the lower stack to facilitate formation of a contact plug on a top surface of a lower source/drain region to be grown from the lower nanosheet stack.

In step S2, a dummy pattern may be formed on one side surface or both side surfaces of the substrate in the D1 direction such that the dummy pattern is not vertically overlapped by the transistor structure and a top surface of the dummy pattern is lower than a top surface of the active pattern in the substrate.

For the formation of the dummy pattern, the substrate may be patterned along the D1 and D3 directions. The substrate may be further patterned along the D2 direction to form the dummy pattern.

Alternatively, the dummy pattern may be formed on the side surface(s) of the substrate by depositing a material including silicon germanium (SiGe) on the transistor structure obtained in the previous operation and patterning the material. This material of the dummy pattern may be different from the material (e.g., silicon) included in the substrate, and instead, may be the same material included in a placeholder structure to be formed in a later step.

In step S3, an STI structure may be formed at D1-direction sides of the substrate including the dummy pattern to isolate the transistor structure from other devices including adjacent transistor structures in the D1 direction.

At this time, the STI structure may also be formed on the top surface of the dummy pattern.

Prior to the formation of the STI structure, an STI liner may be formed on D1-direction side surfaces of the transistor structure including the dummy pattern so that the STI liner may be interposed between the transistor structure and the STI structure.

Alternatively, when the dummy pattern is a structure differently formed on the side surface(s) of the substrate as described in step 2, the STI liner may be formed on the D1-direction side surfaces of the transistor structure before this alternative dummy pattern is formed.

In step S4, the transistor structure may be patterned along the D2 direction to form a space, where lower and upper source/drain regions are to be formed, between the patterned transistor structures arranged in the D2 direction, and a $1^{st}$ recess, below the space, in the substrate below the space.

This patterning of the transistor structure may be performed to form at least two transistor structures, arranged in the D2 direction, and the space where lower and upper source/drain regions of the pattern structures are to be formed. The $1^{st}$ recess may be formed from a top surface of the substrate such that the $1^{st}$ recess penetrates into the substrate.

In step S5, the $1^{st}$ recess formed in the substrate may be filled in with a placeholder structure, and the lower and upper source/drain regions may be formed in the space on the placeholder structure.

The placeholder structure may be formed of a material including silicon germanium (SiGe) that has etch selectivity against silicon oxide (e.g., SiO, SiO2, etc.) forming backside isolation structure and silicon oxide (e.g., SiO, SiO2, etc.) or silicon nitride (e.g., SiN, Si₃N₄, etc.) forming the STI structure when an etchant such as a mixture of nitric acid and hydrofluoric acid is used to etch the placeholder structure. The placeholder structure may be formed of the same material forming the dummy pattern formed in the alternative manner as described above in step 2.

In step S7, the substrate including the dummy pattern may be removed to be replaced by a backside isolation structure such that the backside isolation structure also has a dummy pattern.

At this time, when the dummy pattern is formed in the alternative manner as described above in step 2, the dummy pattern may not be removed when the substrate is removed to be replaced by the backside isolation structure.

For this removal operation, the transistor structure formed in the previous operation may be flipped upside down. The backside isolation structure may be formed of a material including silicon oxide (e.g., SiO, SiO2, etc.), not being limited thereto.

In step S8, the placeholder structure and the dummy pattern may be removed to form a $2^{nd}$ recess after a backside of the transistor structure is planarized to expose bottom surfaces of the placeholder structure and the dummy pattern.

To obtain the $2^{nd}$ recess, the placeholder structure may be first etched to form a recess exposing a bottom surface of the lower source/drain region, and additional etching may be performed to extend this recess in the D1 direction to remove the dummy pattern of the backside isolation structure and also in the D2 direction to increase a width of this recess in that direction.

Alternatively, the dummy pattern of the backside isolation structure may be first removed by an photolithography and etching operation to obtain a recess, and additional etching may be performed to extend this recess in the D1 direction to increase a width of this recess in that direction.

However, when the dummy pattern is a structure differently formed on the side surface(s) of the substrate and formed of the same material as that of the placeholder structure as described above in steps 2 and 5, the $2^{nd}$ recess may be formed by removing the placeholder structure and the dummy pattern at the same time or at the substantially same time using the etchant that selectively etches the placeholder structure and the dummy pattern against the backside isolation structure as described above in step 5.

In step S9, the backside contact plug which includes a metal or metal compound may be formed in the $2^{nd}$ recess to be connected to a bottom surface of the lower source/drain region.

Thus, a 3DSFET device completed from the transistor structure obtained in this step may have an extended backside contact plug that may facilitate an aligned connection with a circuit element such as a backside via without another metal line therebetween. Due to the extended backside contact plug, the 3DSFET device may achieve a reduced size and contact resistance at the backside contact plug and manufacturing flexibility thereof.

Figure 10:
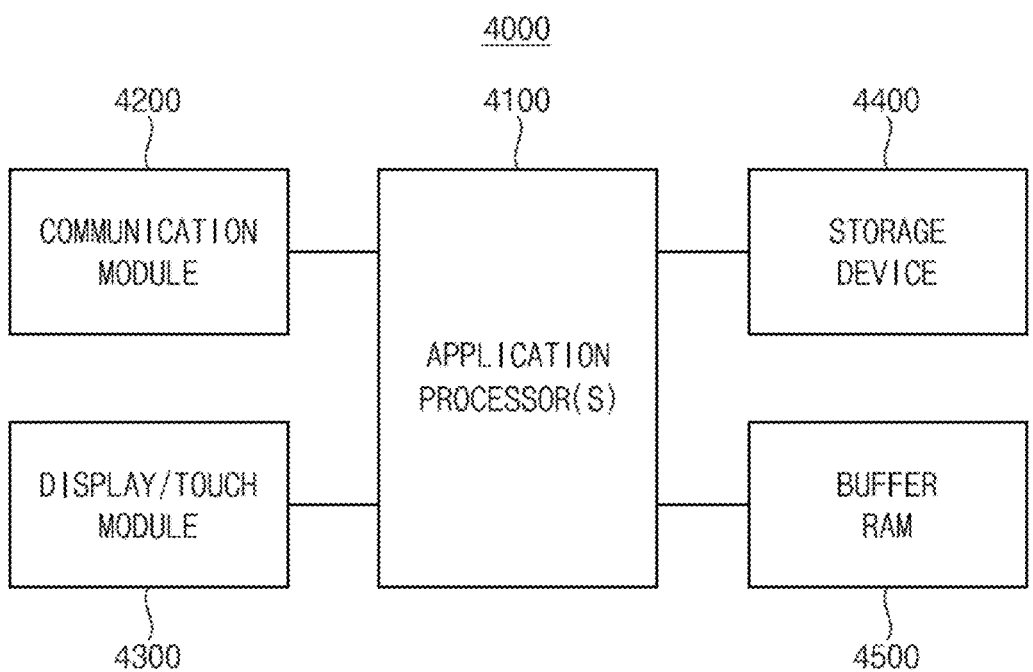
FIG. 10 is a schematic block diagram illustrating an electronic device including a semiconductor device including one or more extended backside contact plugs described in reference to FIGS. 2A-2C to 7, according to an embodiment.

FIG. 10 is a schematic block diagram illustrating an electronic device including a semiconductor device including one or more extended backside contact plugs described in reference to FIGS. 2A-2C to 9, according to an embodiment.

Referring to FIG. 8, an electronic device 4000 may include at least one application processor 4100, a communication module 4200, a display/touch module 4400, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4400 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 8, the electronic device 4000 may further include at least one sensor such as an image sensor.

At least one component in the electronic device 4000 may include semiconductor device including one or more extended backside contact plugs described in reference to FIGS. 2A-2C to 9.

The foregoing is illustrative of example embodiments and is not to be construed as limiting the disclosure. Although some example embodiments have been described above, those skilled in the art will readily appreciate that many modifications are possible in the above embodiments without materially departing from the disclosure.

What is claimed is:

1. A semiconductor device comprising:
a first source/drain region;
a first backside contact plug, at a back side of the semiconductor device, below the first source/drain region connected to the first backside contact plug; and
a shallow trench isolation (STI) structure extending around the first backside contact plug,
wherein the first backside contact plug comprises a first portion that is free of overlap with the first source/drain region in a first direction that is perpendicular to an upper surface of the STI structure,
wherein an uppermost surface of the STI structure is coplanar with an uppermost surface of the first backside contact plug,
wherein a lowermost surface of the STI structure is coplanar with a lowermost surface of the first backside contact plug, and
wherein the STI structure is free of interface therein.

2. The semiconductor device of claim 1, wherein the first portion of the first backside contact plug is free of overlap with the first source/drain region in at least one of a second direction and a third direction that intersects the second direction, and
wherein the second direction and the third direction are parallel with the upper surface of the STI structure.

3. The semiconductor device of claim 1, wherein the first backside contact plug further comprises a second portion that is free of overlap with the first source/drain region in the first direction, wherein the second portion is opposite to the first portion in a a second direction or a third direction that intersects the second direction, and
wherein the second direction and the third direction are parallel with the upper surface of the STI structure.

4. The semiconductor device of claim 1, further comprising a backside isolation structure,
wherein the backside isolation structure comprises a first portion that is free of overlap with the first source/drain region in the first direction.

5. The semiconductor device of claim 4, wherein the first portion of the first backside contact plug extends into the first portion of the backside isolation structure.

6. The semiconductor device of claim 5, wherein the backside isolation structure is between the first backside contact plug and the STI structure in at least one of a second direction and a third direction that intersects the second direction, and
wherein the second direction and the third direction are parallel with the upper surface of the STI structure.

7. The semiconductor device of claim 6, wherein the STI structure is above the first portion of the first backside contact plug.

8. The semiconductor device of claim 4,
wherein the backside isolation structure is between a first side surface of the first portion of the first backside contact plug and the STI structure,
wherein the backside isolation structure is on a second side surface of the first portion of the first backside contact plug,
wherein the first side surface of the first portion of the first backside contact plug extends in a second direction,
wherein the second side surface of the first portion of the first backside contact plug extends in a third direction that intersects the second direction, and
wherein the second direction and the third direction are parallel with the upper surface of the STI structure.

9. The semiconductor device of claim 4,
wherein the first portion of the first backside contact plug faces the STI structure in a second direction without the backside isolation structure therebetween, and
wherein the second direction is parallel with the upper surface of the STI structure.

10. The semiconductor device of claim 1, wherein the first backside contact plug further comprises a second portion that overlaps the first source/drain region in the first direction,
wherein the first portion of the first backside contact plug is extended from the second portion of the first backside contact plug in a second direction,
wherein the first portion of the first backside contact plug has a first width in a third direction that is greater than a second width of the second portion of the first backside contact plug in the third direction that intersects the second direction, and
wherein the second direction and the third direction are parallel with the upper surface of the STI structure.

11. The semiconductor device of claim 10, wherein the second portion of the first backside contact plug has a third width in the third direction, and
wherein the third width is equal to the first width.

12. The semiconductor device of claim 1, further comprising:
a second backside contact plug, at the back side of the semiconductor device, below a second source/drain region connected to the second backside contact plug; and a backside isolation structure between the second back-side contact plug and the first backside contact plug, wherein the second backside contact plug is entirely overlapped by the second source/drain region in the first direction.

13. The semiconductor device of claim 12, wherein the first backside contact plug further comprises a second portion that overlaps the first source/drain region in the first direction, wherein the first portion of the first backside contact plug is extended from the second portion of the first backside contact plug in a second direction, wherein the first portion of the first backside contact plug has a greater width than at least a first part of the second portion of the first backside contact plug in a third direction that intersects the second direction, wherein the second direction and the third direction are parallel with the upper surface of the STI structure, and wherein at least a second part of the second portion of the first backside contact plug has an equal width as the second backside contact plug in the third direction.

14. The semiconductor device of claim 1, further comprising backside metal lines, at the back side of the semiconductor device, wherein at least one of the backside metal lines is connected to the first backside contact plug, wherein the backside metal lines are arranged in a second direction and extend in a third direction, and wherein the backside metal lines overlap the first backside contact plug in the first direction in a cross-section view in the second direction.

15. A semiconductor device comprising:

a source/drain region;

a backside contact plug, at a back side of the semiconductor device, below the source/drain region connected to the backside contact plug, wherein the backside contact plug comprises an extended portion that is free of overlap with the source/drain region in a first direction;

backside metal lines at the back side of the semiconductor device; and a shallow trench isolation (STI) structure extending around the backside contact plug, wherein at least one of the backside metal lines is connected to the backside contact plug, wherein the backside metal lines are arranged in a second direction and extend in a third direction, wherein the backside metal lines overlap the backside contact plug in the first direction in a cross-section view in the second direction, wherein the second direction intersects the third direction, wherein the second direction and the third direction are parallel with an upper surface of the STI structure, wherein the first direction is perpendicular to the upper surface of the STI structure, wherein an uppermost surface of the backside contact plug is coplanar with an uppermost surface of the STI structure, wherein a lowermost surface of the backside contact plug is coplanar with a lowermost surface of the STI structure, and wherein the STI structure is a monolithic structure.

16. The semiconductor device of claim 15, wherein at least one of the backside metal lines overlaps the extended portion of the backside contact plug in the first direction.

17. The semiconductor device of claim 16, wherein the at least one of the metal lines is connected to the extended portion of the backside contact plug.

18. A method of manufacturing a semiconductor device, the method comprising:

providing a transistor structure comprising a channel stack on a substrate;

forming a dummy pattern at a side surface the substrate such that the dummy pattern is free of overlap with the channel stack;

forming a first recess, in the substrate, below a space where a source/drain region is to be formed;

forming a source/drain region on the channel stack in the space above the first recess;

opening the first recess from a bottom thereof and removing the dummy pattern to form a second recess; and filling the second recess with a backside contact plug connected to the source/drain region such that the backside contact plug comprises an extended portion, corresponding to the dummy pattern, wherein the extended portion is free of overlap with the source/drain region in a first direction that is perpendicular to an upper surface of the substrate.

19. The method of claim 18, wherein the forming the dummy pattern comprises patterning the substrate to obtain the dummy pattern as a part of the substrate, and wherein the dummy pattern and the substrate have a same material composition.

20. The method of claim 19, further comprising forming a placeholder structure in the first recess prior to the forming the source/drain region, wherein the opening the first recess and removing the dummy pattern comprises:

removing the placeholder structure to obtain a third recess; and extending the third recess by the removing the dummy pattern, thereby obtaining the second recess.

* * * * *